United States Patent
Moore

(10) Patent No.: US 7,395,290 B2
(45) Date of Patent: Jul. 1, 2008

(54) DIGITAL FILTER AND METHOD THEREOF USING FREQUENCY TRANSLATIONS

(75) Inventor: George S. Moore, Veradale, WA (US)

(73) Assignee: Agilent Technologies, Inc., Santa Clara, CA (US)

( * ) Notice: Subject to any disclaimer, the term of this patent is extended or adjusted under 35 U.S.C. 154(b) by 742 days.

(21) Appl. No.: 10/861,867

(22) Filed: Jun. 4, 2004

(65) Prior Publication Data

US 2005/0273482 A1    Dec. 8, 2005

(51) Int. Cl.
*G06F 17/10* (2006.01)
(52) U.S. Cl. ...................................... 708/300
(58) Field of Classification Search ................. 708/300, 708/309
See application file for complete search history.

(56) References Cited

U.S. PATENT DOCUMENTS 5,375,146 A * 12/1994 Chalmers ..................... 708/313
6,219,088 B1 * 4/2001 Liu et al. ...................... 348/21
2001/0008549 A1 * 7/2001 Hashimoto .................. 375/316

\* cited by examiner

*Primary Examiner*—Tan V. Mai

(57) ABSTRACT

A digital filter and method of filtering frequency translate or shift a spectrum of a digital input signal and further filter a translated signal to reduce or attenuate frequency components in the spectrum of the input signal. The digital fitter includes first and second translators and a first filter. The first filter is connected between the first and second translators and is centered approximately at direct current (DC). The digital filter may further include a second filter, a third translator connected to an output of the second filter, a complex local oscillator connected to an input of each translator, and a complex-to-real converter connected to an output of the third translator. The method includes frequency translating the digital input signal and separately frequency translating a first translated signal after the first translated signal is filtered to produce a second translated signal.

38 Claims, 10 Drawing Sheets

DIGITAL FILTER AND METHOD THEREOF USING FREQUENCY TRANSLATIONS

BACKGROUND

In modern systems such as, but not limited to, communications systems and radar systems, it is not uncommon to encounter so called 'interfering' signal or signals coexisting with a signal or signals of interest. For example, such interfering signals or 'interferers' often have a frequency that is near to, but outside of, a band edge of a frequency extent occupied by the signal of interest. In other situations, the interferer may be located inside the frequency extent of the signal of interest. Moreover, in many cases, either the so-called 'close-in' interfering signal or the so-called 'in-band' interfering signal is a narrowband signal (e.g., a frequency tone) that, at times, may exhibit a time-varying frequency characteristic.

The presence of such interfering signals can and generally does corrupt or interfere with processing of the signal of interest by the system. As such, the challenge facing the system receiver/signal processor is to provide some form of filtering that reduces or eliminates the interfering signal while minimally affecting the signal(s) of interest. Typically, such filtering takes the form of one or more of a notch or bandstop filter, a lowpass filter, a highpass filter and a bandpass filter.

Digital systems and mixed systems, systems having both analog and digital portions, often employ digital filters following an analog-to-digital converter (ADC). Such digital filters provide some or all of the filtering for the system.

The ADC 'digitizes' or converts an analog input signal, generally including both the signal(s) of interest and the interfering signal(s), into a digital signal. In addition to digitizing both the signal(s) of interest and the interfering signal(s), the ADC may introduce signal distortions and/or spurious signals such as direct current (DC) offsets and/or unwanted spectral components associated with sampling frequency sub-harmonics. Therefore, systems occasionally employ various forms of specialized digital filtering in an attempt to mitigate the effects of such ADC-related signal distortions and/or spurious signals on the signal of interest within the digital system.

Unfortunately, conventional digital filtering approaches often exhibit rather limited capability especially with respect to the ever-higher digital data rates being employed in many modern systems. In particular, many approaches to conventional digital filtering, while theoretically providing attractive characteristics, simply cannot be realized for data rates associated with current and future digitizing or sampling frequencies. In addition, complexity of such filtering approaches may preclude or at least limit their application in certain modern systems.

Accordingly, it would be advantageous to have an approach for digital filtering that was capable of dealing with the filtering needs of such modern systems while simultaneously having a potential for lower complexity in a practical implementation. Such a digital filtering approach would solve a long-standing need in the area of filtering in digital systems.

BRIEF SUMMARY

In some embodiments of the invention, a digital filter that filters a digital input signal is provided. The digital filter comprises a first frequency translator that frequency shifts the digital input signal to produce a first translated signal. The digital filter further comprises a first filter that attenuates frequency components in the first translated signal to produce a filtered first translated signal. The digital filter further comprises a second frequency translator that frequency shifts the filtered first translated signal to produce a second translated signal. The first filter is centered approximately at direct current (DC).

In some embodiments of the invention, a digital notch filter that removes an interfering signal from a signal of interest is provided. The digital notch filter comprises a plurality of frequency translators each having a signal input and a signal output. The signal input of a first translator of the plurality of frequency translators is connected to an input port of the digital notch filter. The digital notch filter further comprises a plurality of digital filters. A first filter of the plurality of digital filters is connected between the signal output of the first translator and the signal input of a second frequency translator. A second digital filter is connected between the signal output of the second translator and the signal input of a third frequency translator. The digital notch filter further comprises a complex local oscillator (LO) having an output connected to an LO input of each translator of the plurality of frequency translators; and a complex-to-real converter connected between an output of the third translator and an output port of the digital notch filter.

In some embodiments of the invention, a method of filtering a digital signal using frequency translations is provided. The method of filtering comprises frequency translating a digital input signal to create a first translated signal that is a complex signal. The method of filtering further comprises filtering the first translated signal to produce a filtered first translated signal. The method of filtering further comprises frequency translating the filtered first translated signal to create a second translated signal, wherein filtering is centered approximately at direct current (DC).

Certain embodiments of the present invention have other features in addition to and in lieu of the features described hereinabove. These and other features of the invention are detailed below with reference to the following drawings.

BRIEF DESCRIPTION OF THE DRAWINGS

The various features and embodiments of the present invention may be more readily understood with reference to the following detailed description taken in conjunction with the accompanying drawings, where like reference numerals designate like structural elements, and in which.

DETAILED DESCRIPTION

Various embodiments of the present invention facilitate digital filtering by employing frequency translations of an input signal. According to the embodiments of the present invention, the frequency translations essentially spectrally relocate the input signal to a frequency range that is more amenable to filtering and/or filter realization than that of the input signal prior to translation. As such, a generally simpler or lower complexity filter subsection may be employed, and/or the filter as a whole may handle a higher data rate, than would have been possible in the absence of such frequency translation. In addition, the frequency translations make possible simpler and more effective implementations of tunable or trackable filters. The embodiments of the present invention apply to, but are not limited to, bandstop and bandpass filters used in various modern digital systems such as digital signal processing and digital communication systems.

Figure 1:
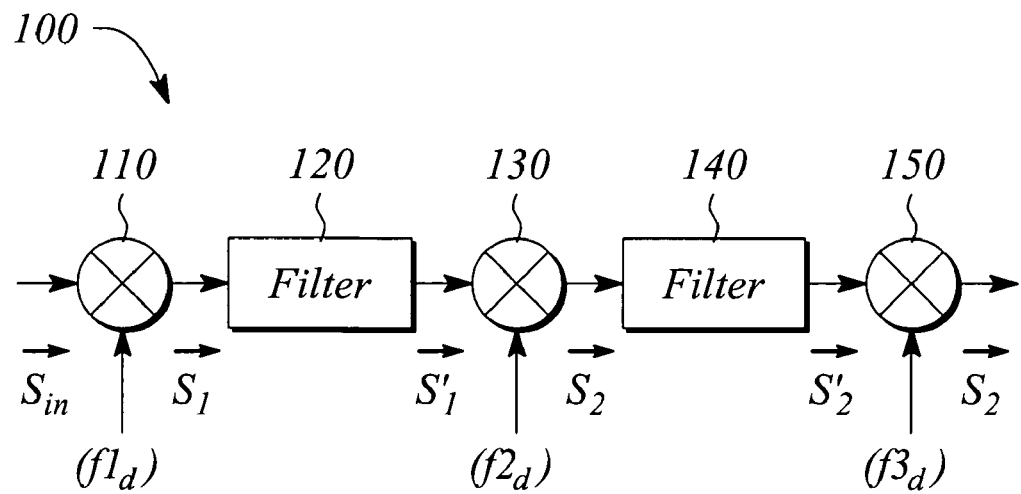
FIG. 1 illustrates a block diagram of digital filter using frequency translations according to an embodiment of the present invention.

FIG. 1 illustrates a block diagram of digital filter 100 using frequency translations according to an embodiment of the present invention. The digital filter 100 accepts an input signal $S_{in}$ at an input port. The input signal $S_{in}$ is a digital signal comprising a sequence of digital samples $S_{in}(n)$ indexed on n and having a data rate or sampling frequency $F_s$. The input signal $S_{in}$, or perhaps more correctly the input signal samples $S_{in}(n)$, may be either a real valued signal (hereinafter a 'real signal') or a complex valued signal (hereinafter a 'complex signal'). Unless necessary for understanding, no distinction is made herein between the input signal $S_{in}$ itself and the digital samples of the input signal $S_{in}(n)$, both generally being referred to as $S_{in}$.

In some embodiments, the input signal $S_{in}$ is a real signal generated from an analog input signal by an analog-to-digital converter (ADC) operating at a sample rate or sampling frequency $F_s$. In other embodiments, the input signal generated by the ADC is a complex signal. In yet other exemplary embodiments, the input signal $S_{in}$ may be either a real or a complex signal that is generated by a digital signal generator running at a data rate of $F_s$. In yet other exemplary embodiments, the input signal $S_{in}$ may be either a real or a complex signal that is generated by reading data values stored in a memory at a data read rate of $F_s$, or is produced by another similar means for generating a digital signal. The ADC or the various digital signal generating means are not illustrated in FIG. 1 for simplicity.

The input signal $S_{in}$, whether a real signal or a complex signal, generally includes a signal or signals of interest. In addition, the input signal $S_{in}$ may include one or more of an interfering signal or signals $S_I$ and a spurious signal or signals $S_p$, as well as various forms of signal distortions including, but not limited to, a direct current (DC) offset of the signal of interest.

The digital filter 100 comprises a first frequency translator 110. The first frequency translator 110 accepts the input signal $S_{in}$ at a signal input. The first frequency translator 110 translates or shifts a spectrum of the input signal $S_{in}$ by a first shift frequency $f1_d$. An output of the frequency translator 110 is a first translated signal $S_1$. The first translated signal $S_1$ is a digital signal. For example, if the first shift frequency $f1_d$ is equal to 30 MHz, the first translated signal $S_1$ produced by the first frequency translator 110 is simply the input signal $S_{in}$ shifted in frequency by 30 MHz.

In some embodiments, the first translated signal $S_1$ is a complex signal. In particular, in some embodiments, the first translator 110 accepts a real input signal $S_{in}$ and produces a complex valued, first translated signal $S_1$. In other embodiments, the first frequency translator 110 accepts a complex input signal $S_{in}$ and produces a complex valued, first translated signal $S_1$. For example, the first translator 110 may essentially multiply the real valued input signal $S_{in}$ by a complex exponential (e.g., $e^{j\omega_d t}$ where $\omega_d = 2\pi f_d$). Such a multiplication results in a frequency shift $f_d$ of all of the spectral components of an input signal (e.g., real $S_{in}$), as well as produces a complex valued output signal (e.g., complex $S_1$).

The digital filter 100 further comprises a first filter 120. The first translated signal $S_1$ is received at an input of the first filter 120 and is filtered thereby to produce a filtered, first translated signal $S'_1$ at an output of the first filter 120. For example, the first filter 120 may be a highpass filter that attenuates frequency components in the first translated signal $S_1$ below a cut-off frequency of the first filter 120. In another example, the first filter 120 is a lowpass filter that attenuates frequency components of the first translated signal $S_1$ above a cut-off frequency of the first filter 120. In yet other examples, the first filter 120 may be a notch or bandstop filter or a bandpass filter. In yet other examples, the first filter 120 may be a plurality of filters connected in parallel and/or in series, the plurality including, but not limited to, a selection of highpass filters, lowpass filters, notch/bandstop filters, and bandpass filters. Note that, as used herein, the terms 'notch' and 'bandstop' are equivalent and are used interchangeably to describe filters and filtering.

The first filter 120 is centered in a vicinity of direct current (DC) or 0 Hz. In addition, the first translated signal signal $S_1$ has frequency components to be filtered that are shifted to a 'vicinity of DC' by the action of the first translator 110. As used herein, a filter or filtering 'centered in vicinity of DC' means that a characteristic of the filter or the filtering is located near DC. An equivalent way of describing 'filters and filtering centered in a vicinity of DC' as used herein is to refer to the filters as 'baseband filters' and the filtering as 'baseband filtering'.

For example, a highpass filter centered in a vicinity of DC has a maximum attenuation (e.g., one or more zeros) located at or near DC. Such a highpass filter provides filtering (e.g., rejects) signal components near DC while passing signal components above a cut-off frequency of the highpass filter. In another example, a lowpass filter center in vicinity of DC passes signal components in the vicinity of DC and rejects signal components away from DC (e.g., above a cut-off of the lowpass filter). Importantly, the filter being centered in a vicinity of DC greatly simplifies an implementation of the filter and may enable filtering of higher speed data than if the filter were implemented at a frequency shifted from DC.

The digital filter 100 further comprises a second frequency translator 130. The second frequency translator 130 accepts the filtered, first translated signal $S'_1$ at a signal input thereof. The second frequency translator 130 translates or shifts a spectrum of the filtered, first translated signal $S'_1$ by a second shift frequency $f2_d$. An output of the second frequency translator 130 is a second translated signal $S_2$. The second translated signal $S_2$ is a digital signal. Generally, the second translated signal $S_2$ is a complex signal. However, the second translated signal $S_2$ may be a real signal, in some embodiments.

For example, the second shift frequency $f2_d$ may be equal to −30 MHz in which case, the second translated signal $S_2$ produced by the second frequency translator 130 is simply the filtered translated signal $S'_1$ shifted in frequency by −30 MHz. In an exemplary situation where the second shift frequency $f2_d$ is essentially equal in magnitude but opposite in sign (i.e., shift direction) to the first shift frequency $f1_d$, the second translated signal $S_2$ is essentially returned by the second frequency translator 130 to a spectral condition of the input signal $S_{in}$ with the exception of any spectral changes (i.e., filtering) introduced by action of the first filter 120.

In a second example, the second frequency translator 130 shifts the filtered translated signal $S'_1$ by $f2_d$ equal to −60 MHz. In the second example, the second translated signal $S_2$ is not returned to a spectral condition of the input signal $S_{in}$. Instead, the translated signal $S_2$ has a net frequency translation (e.g., −30 MHz) relative to the input signal $S_{in}$ in addition to any spectral changes (i.e., filtering) introduced by action of the first filter 120.

In some embodiments, the digital filter 100 further comprises a second filter 140. The second translated signal $S_2$ passes through and is filtered by the second filter 140 to produce a filtered, second translated signal $S'_2$. For example, the second filter 140 may be a highpass filter that attenuates frequency components in the second translated signal $S_2$ below a cut-off frequency of the second filter 140. In some embodiments, the second filter 140 is essentially similar to the first filter 120. In other examples, the second filter 140 may be a lowpass filter, a notch filter, or a bandpass filter. In yet other examples, the second filter 140 may be a plurality of filters connected in parallel and/or series including, but not limited to, a selection of highpass filters, lowpass filters, notch filters, and bandpass filters.

In some embodiments, the digital filter 100 further comprises a third frequency translator 150. The third frequency translator 150 accepts the filtered, second translated signal $S'_2$ at a signal input thereof. The third frequency translator 150 then translates or shifts a spectrum of the filtered, second translated signal $S'_2$ by a third shift frequency $f3_d$. An output of the third frequency translator 150 is a third translated signal $S_3$. The third translated signal 53 is a digital signal. In some embodiments, the third translated signal 53 is a complex signal.

For example, the third shift frequency $f3_d$ may be equal to 30 MHz in which case, the third translated signal $S_3$ produced by the third frequency translator 150 is simply the filtered, second translated signal $S'_2$ shifted in frequency by 30 MHz. In the case of the second example described hereinabove, where the second translated signal $S'_2$ had a net frequency shift of −60 MHz, the third translated signal $S_3$ is essentially returned by the third frequency translator 150 to a spectral condition of the input signal $S_{in}$ with the exception of any spectral changes (i.e., filtering) introduced by the combined action of both the first filter 120 and the second filter 140.

Figure 2:
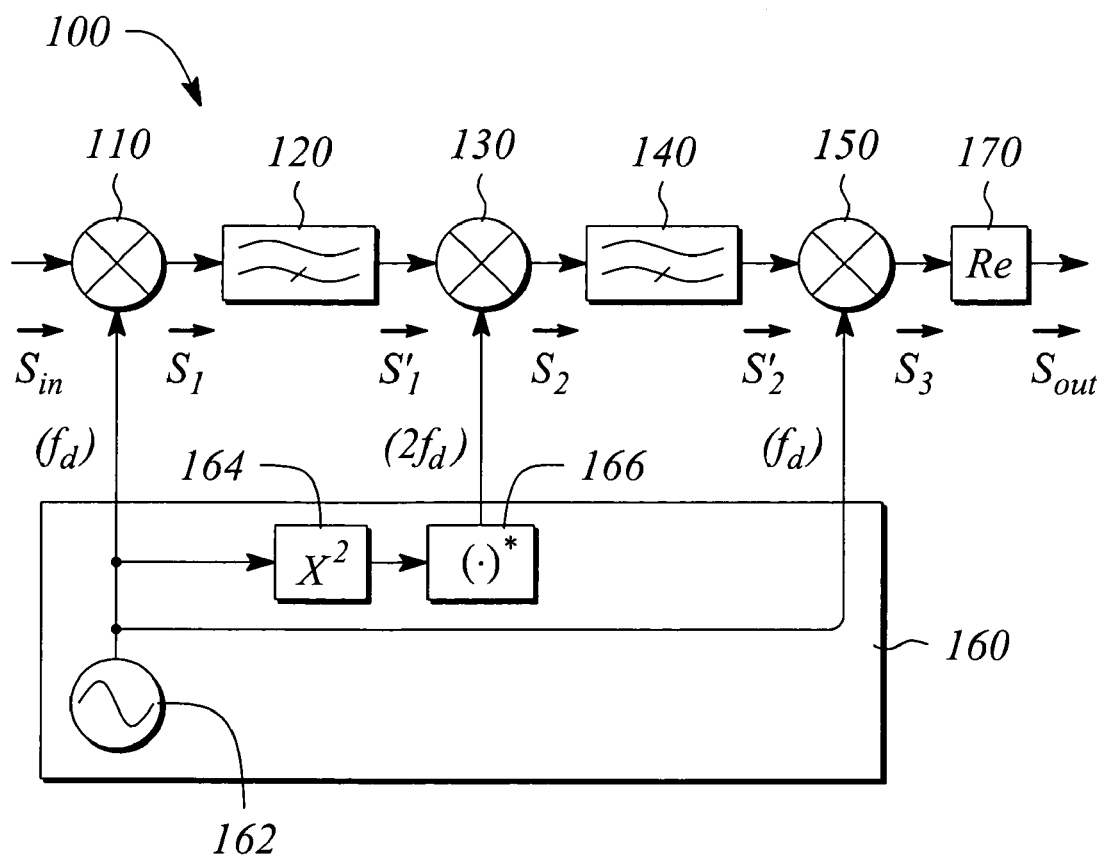
FIG. 2 illustrates a block diagram of an exemplary digital notch filter according to an embodiment of the present invention.

To better understand and appreciate the digital filter 100 according to the present invention, consider a realization of the digital filter 100 as a digital notch or bandstop filter. FIG. 2 illustrates a block diagram of an exemplary digital notch filter 100 according to an embodiment of the present invention. The exemplary digital notch filter 100 may be employed to attenuate and/or essentially remove an interfering signal or signals, for example.

The digital notch filter 100 comprises the first frequency translator 110, the first filter 120, the second frequency translator 130, the second filter 140, and the third frequency translator 150, as described and arranged hereinabove with reference to FIG. 1. The digital notch filter 100 further comprises a complex local oscillator 160 and a complex-to-real converter 170. A first output of the complex local oscillator (LO) 160 is connected to an LO input of the first frequency translator 110. A second output of the complex LO 160 is connected to an LO input of the second frequency translator 130, while a third output of the complex LO 160 is connected to an LO input of the third frequency translator 150. The complex-to-real converter 170 is connected between an output of the third frequency translator 150 and an output of the digital notch filter 100. In general, as one skilled in the art can readily attest, path lengths (e.g., delays) of the various outputs of the complex LO 160 should be matched to that of the signal path, especially when employing pipelining in the signal path.

As illustrated in FIG. 2, each of the first frequency translator 110, the second frequency translator 130, and the third frequency translator 150 is a different complex multiplier, each having a first input, a second input, and an output. The first input of each complex multiplier corresponds to the signal input of a respective frequency translator 110, 130, 150, while the second input of each complex multiplier corresponds to an LO input of the respective frequency translator 110, 130, 150.

The complex multiplier, as used herein, is any device, circuit, or function that essentially computes a complex valued product of a signal applied to the first or signal input and a signal applied to the second or LO input. The complex multiplier may be realized in a variety of ways, depending on a particular implementation and application of the digital notch filter 100. For example, the complex multiplier may be realized as a circuit, or a portion of a discrete or integrated digital circuit, such as, but not limited to, a circuit of a field programmable gate array (FPGA) or a circuit in an application specific integrated circuit (ASIC). Alternatively, the complex multiplier may be a function or operation provided by a signal processor circuit or system or a function/subroutine of a computer program executed by a general purpose processor, such as a microprocessor.

In the exemplary digital notch filter 100, the first filter 120 and the second filter 140 are each highpass filters. In general, each of the highpass filters has a stop band in a vicinity of zero frequency (i.e., 0 Hz) or DC and a passband extending from and above a cut-off frequency. The highpass filters each accepts a complex signal at an input and produces a filtered complex signal at an output.

In some embodiments, the first and second highpass filters 120, 140 are essentially similar filters. In other embodiments, the first and second highpass filters 120, 140 have different cut-off frequencies and different sets of passband characteristics. A particular cut-off frequency and set of passband characteristics for each highpass filter generally depend on a particular application of the digital notch filter 100. For example, the cut-off frequency may be chosen to be below a lower band edge of a frequency band containing the signal of interest. One skilled in the art can readily determine the cut-off frequency and various characteristics of the passband without undue experimentation.

Essentially any approach to realizing highpass filters that can filter complex signals may be employed for the highpass filters used as the filters 120, 140 in the exemplary digital notch filter 100. For example, the highpass filter may be realized as an inherently complex filter that directly processes complex signals. In another example, the highpass filter may be realized as a pair of real filters connected in parallel. When realized as a parallel pair of real filters, a first real filter may filter a so-called 'in phase' or 'I' component of the complex signal, while a second real filter may filter a so-called 'quadrature' or 'Q' component of the complex signal. Other combinations of highpass filters that, when combined, are capable of providing highpass filtering of a complex signal are also within the scope of the present invention.

Similarly, the complex LO 160 may be implemented in any number of application specific ways including, but not limited to, one or more of a numerically controlled oscillator, a numerical synthesizer, a programmable function/waveform generator, a function within a signal processor circuit or system, or a function/subroutine of a computer program executed by a general purpose processor, such as a microprocessor. In addition, the complex LO 160 may include additional elements such as, but not limited to, frequency multipliers and signal conjugators (i.e., elements that produce a complex conjugate of an input signal). Each of these additional elements likewise may be implemented as discrete or integrated circuits, functions within a signal processor, or functions/subroutines of a computer program executed by a processor, such as a microprocessor.

For example, as illustrated in FIG. 2, the complex LO 160 produces a first LO signal $S1_{LO}$ at the first output, a second LO signal $S2_{LO}$ at the second output, and a third LO signal $S3_{LO}$ at the third output. In the exemplary digital notch filter 100, the first LO signal $S1_{LO}$ and the third LO signal $S3_{LO}$ are essentially identical signals, while the second LO signal $S2_{LO}$ is a complex conjugate of a square of the first LO signal $S1_{LO}$.

As such, the complex LO 160 illustrated in FIG. 2 comprises a numerically controlled oscillator (NCO) 162, an output of which (NCO 162) is connected to each of the first and third outputs of the complex LO 160. The NCO 162 generates a complex signal that is essentially a digital representation or version of the complex exponential $e^{j\omega_d t}$. In particular, the first LO signal $S1_{LO}$ and third LO signal $S3_{LO}$ may be described by $$S1_{LO}(n) = S3_{LO}(n) = e^{j\frac{\omega_d}{F_s}n}; \omega_d = 2\pi f_d \quad (1)$$

where $F_s$ is a sample frequency (i.e., data rate) and $f_d$ is the shift frequency. Thus, applying the first LO signal $S1_{LO}$ to the first frequency translator 110 produces a first frequency shift $f1_d$ equal to $f_d$. Similarly, a third frequency shift $f3_d$ equal to $f_d$ is produced by applying the third LO signal $S3_{LO}$ to the third frequency translator 150.

The complex LO 160 further comprises a complex squaring circuit 164. The complex squaring circuit 164 multiplies the signal produced by the NCO 162 by itself (i.e., 'squares' the signal). The complex LO 160 further comprises a complex conjugator 166 connected between an output of the complex squaring circuit 164 and the second output of the complex LO 160. The complex conjugator 166 computes a complex conjugate of a signal applied thereto. As such, the second LO signal $S2_{LO}$ may be described by $$S2_{LO}(n) = e^{-j\frac{2\omega_d}{F_s}n}; \omega_d = 2\pi f_d \quad (2)$$

where '2' in the exponent results from the action of the complex squaring circuit 164 while the minus, '−', in the exponent is produced by the action of the complex conjugator 166. Inspection of equations (1) and (2) reveals that the second LO signal $S2_{LO}$, when applied to the second frequency translator 130, produces a second frequency shift $f2_d$ equal to $-2f_d$. In other words, the second frequency shift $f2_d$ is twice as large as and in an opposite spectral direction with respect to the other two frequency shifts $f1_d$ and $f3_d$ for the exemplary digital notch filter 100 illustrated in FIG. 2.

One skilled in the art is aware that the second LO signal $S2_{LO}$ described hereinabove may be produced by a variety of approaches instead of that illustrated in FIG. 2. For example, the second LO signal producing the second frequency shift $f2_d$ equal to $-2f_d$ may be generated directly from a doubled phase accumulator of the NCO 162. All such approaches to generating the second LO signal are within the scope of the present invention. Furthermore, the approach illustrate in FIG. 2 is provided for discussion purposes only and not by way of limitation.

Now, consider an example of applying the exemplary digital notch filter 100 to filter a real signal. In particular, in this example, the digital notch filter 100 is used to filter an exemplary real signal having both a signal of interest and an interfering signal. The digital notch filter 100 acts to remove the interfering signal from the exemplary real signal, while minimally degrading the signal of interest.

Figure 3A:
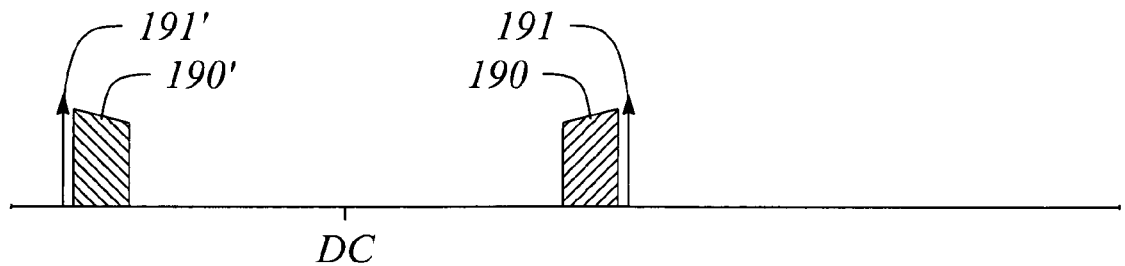
FIG. 3A illustrates an analog spectrum of an exemplary signal at an input of an analog-to-digital converter (ADC) according to an embodiment of the present invention.

FIG. 3A illustrates an analog spectrum of the exemplary signal at an input of an ADC according to an embodiment of the present invention. Assume the ADC is at the input to the notch filter 100 of FIG. 2. The analog spectrum includes both a signal of interest 190 and an interfering signal 191 located in a positive frequency portion of the spectrum. Assume, for the example illustrated in FIG. 3A, that the signal of interest 190 occupies a frequency range from 60 MHz to 80 MHz centered at 70 MHz (i.e., the crosshatched trapezoid 190), while the interfering signal 191 for the example is a narrow band signal or tone centered at 82 MHz (i.e., the vertical arrow 191). Further, the analog spectrum includes an image of the signal of interest 190' along with an image of the interfering signal 191', both of which are located in a negative frequency portion of the spectrum. Specifically for this example, the image of the signal of interest 190' is centered at −70 MHz and extends from −60 MHz to −80 MHz while the image of the interfering signal 191' is centered at −82 MHz.

Figure 3B:
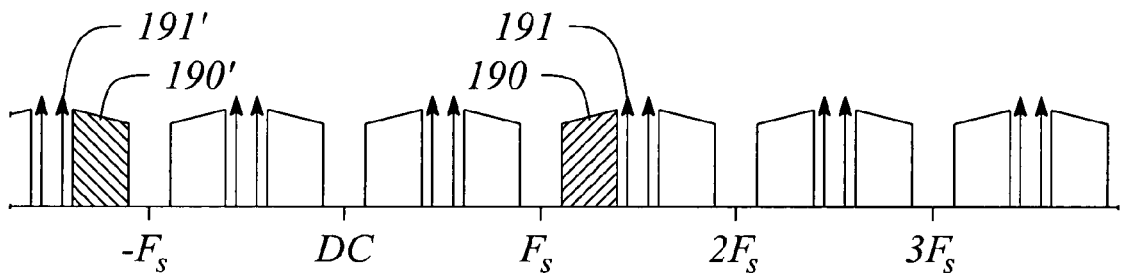
FIG. 3B illustrates a spectrum of a digital signal resulting from sampling the analog signal illustrated in FIG. 3A using the ADC.

FIG. 3B illustrates a spectrum of a digital signal resulting from sampling the analog signal illustrated in FIG. 3A using the ADC. For the example, assume that a sampling frequency $F_s$ equal to 56 MHz is used by the ADC to sample the analog signal of FIG. 3A. As illustrated in FIG. 3B, the digital signal produced by the ADC is the input signal $S_{in}$ to be filtered, as discussed hereinabove with respect to the exemplary digital notch filter 100 illustrated in FIG. 2.

Sampling of any analog signal using an ADC produces in the digital signal spectral features or artifacts that are the result of so-called 'sampling replication'. In particular, sampling replication produces in the digital signal spectral features in the form of frequency components that correspond to, or are replicas of, frequency components in the analog signal. In terms of the frequency components of an analog signal f, sampling replication results in frequency components $f^{<s>}$ in a digital signal spectrum given by $$f^{<s>} = \pm f \pm nF_s; \quad n=1, 2, 3, \quad (2)$$

As such, a spectrum of the digital signal is essentially the analog spectrum (both positive and negative frequency portions) replicated at spectral intervals delineated by integer multiples of the sampling frequency $F_s$ (e.g., 56 MHz). In addition, each positive integer multiple of the sampling frequency $F_s$ in the digital spectrum essentially corresponds to DC (i.e., 0 Hz) with respect to a spectral interval located directly above the particular sampling frequency $F_s$ integer multiple. Similarly, each negative integer multiple of the sampling frequency $F_s$ in the digital spectrum essentially corresponds to DC with respect to a spectral interval located directly below the particular sampling frequency $F_s$ integer multiple.

For the example, the interfering signal 191 and its image 191' are replicated by sampling replication, such that replicas of the interfering signal 191 and its image 191' appear at ±26 MHz, ±30 MHz, ±82 MHz, ±86 MHz, and so on. Similarly, the signal of interest 190 and its image 190' are replicated in each of the spectral intervals. Thus for example, in a spectral interval from DC to 56 MHz, a replica of the interfering signal 191 and a replica of the interfering signal image 191' (e.g., signals illustrated at 26 MHz and 30 MHz) are bracketed by a replica of the signal of interest 190 and a replica of the signal of interest image 190'. Replicas are not crosshatched in FIGS. 3B-3G enabling them to be visually distinguished for illustration purposes from the signal of interest 190 and its image 190'.

For the purposes of discussion hereinbelow, the interfering signal 191, its image 191' and the replicas thereof are referred to generically hereinbelow as 'interfering signal replicas' except where a distinction is necessary for understanding. Similarly, the signal of interest 190, its image 190' and the replicas thereof are referred to generically hereinbelow as 'signal of interest replicas' except where a distinction is necessary for understanding. Thus, each spectral interval comprises a first signal of interest replica, a pair of interfering signal replicas comprising a first and a second interfering signal replica, and a second signal of interest replica.

Figure 3C:
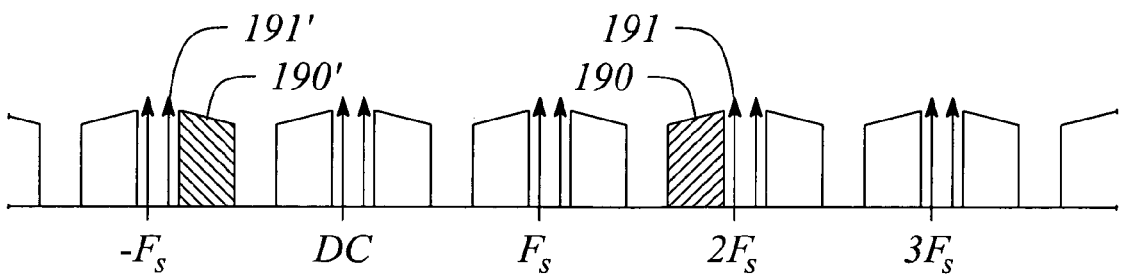
FIG. 3C illustrates a spectrum of a first translated signal produced by a first frequency translator from the digital signal illustrated in FIG. 3B.

Continuing with the example using the exemplary digital notch filter 100, FIG. 3C illustrates a spectrum of the first translated signal $S_1$ produced by the first frequency translator 110 from the digital input signal $S_{in}$ illustrated in FIG. 3B. For the example, a first frequency shift $f1_d$ equal to $f_d$ (e.g., 30 MHz) is assumed. As such, the first translated signal $S_1$ is essentially the input signal $S_{in}$ shifted in frequency by $f_d$. In particular, the original locations of the signal of interest 190 and the interfering signal 191 in FIG. 3B are shifted up in frequency by $f_d$ (e.g., 30 MHz) in FIG. 3C (e.g., note the shift in location of the crosshatched signal of interest 190 in FIG. 3C relative to FIG. 3B). The images of the signal of interest 190' and the interfering signal 191' as well as all of the replicas are similarly shifted up in frequency by $f_d$ (e.g., 30 MHz). The effect is to shift a first one of the interfering signal 191 replicas to DC. Simultaneously, a corresponding first one of the other pairs of interfering signal 191 replicas is shifted to a respective one of the integer multiples of the sampling frequency $F_s$.

Figure 3D:
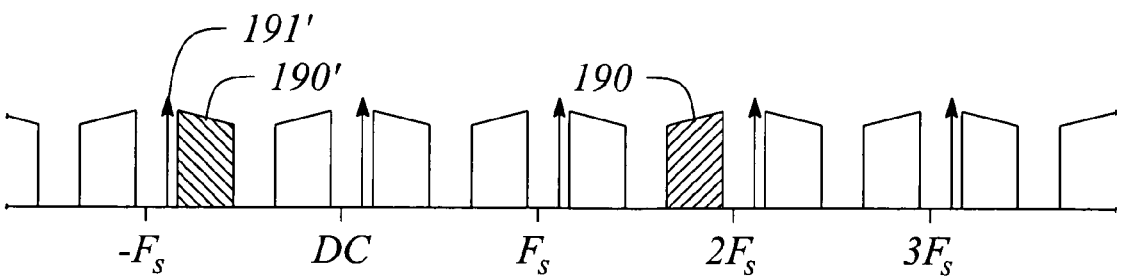
FIG. 3D illustrates a spectrum of a first filtered signal produced by a first highpass filter from the first translated signal illustrated in FIG. 3C.

FIG. 3D illustrates a spectrum of the first filtered signal $S'_1$ produced by the first highpass filter 120 from the first translated signal $S_1$ illustrated in FIG. 3C. The highpass filter 120 has a stop band in the vicinity of DC. In addition, the stop band of the highpass filter 120 is replicated in each of the spectral intervals in a manner analogous to that discussed hereinabove with respect to the frequency components of the signal. Specifically, the highpass filter 120 stop band is replicated in the vicinity of each integer multiple of the sampling frequency $F_s$.

As a result, the first one of the two interfering signal replicas between each pair of signal of interest replicas is essentially removed by filtering, leaving the spectrum illustrated in FIG. 3D. Note that a cutoff frequency of the highpass filter 120 is sufficiently close to DC to insure that the signal of interest replica is not adversely affected by the stop band attenuation of the filter 120. One skilled in the art can readily determine a cut-off frequency and various associated characteristics of both the stop band and a passband of the highpass filter 120 for a given application of the digital notch filter 100, such that the filter does not adversely affect the signal of interest replica, without undue experimentation.

Figure 3E:
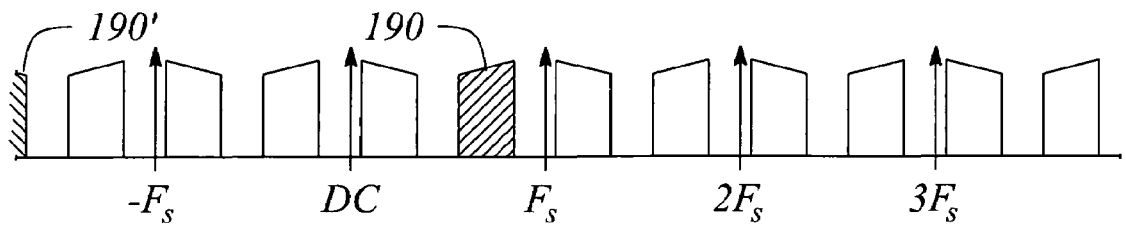
FIG. 3E illustrates a spectrum of a second translated signal produced by a second frequency translator from the first filtered signal illustrated in FIG. 3D.

FIG. 3E illustrates a spectrum of the second translated signal $S_2$ produced by the second frequency translator 130 from the first filtered signal $S'_1$ illustrated in FIG. 3D. For the example, a second frequency shift $f2_d$ equal to minus $2f_d$ (e.g., −60 MHz) is assumed. As such, the second translated signal $S_2$ is essentially the first filtered signal $S'_1$ shifted in frequency by minus $2f_d$. In particular, the shifted locations of the signal of interest replicas and the interfering signal replicas in the first filtered signal $S'_1$ are shifted down in frequency by $2f_d$ (e.g., −60 MHz) (e.g., note the shift in the location of the crosshatched signal of interest 190 in FIG. 3D relative to FIG. 3E). Thus, one of the interfering signal replicas remaining in the spectrum is shifted to DC, while the other remaining interfering signal replicas are shifted to a respective one of the integer multiples of the sampling frequency $F_s$.

Figure 3F:
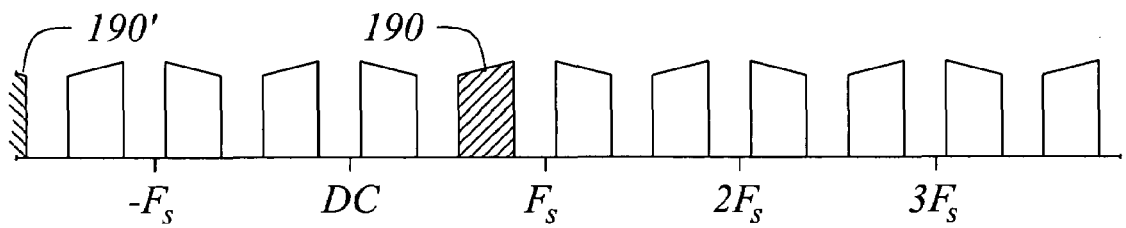
FIG. 3F illustrates a spectrum of a second filtered signal produced by a second highpass filter from the second translated signal illustrated in FIG. 3E.

FIG. 3F illustrates a spectrum of the second filtered signal $S'_2$ produced by the second highpass filter 140 from the second translated signal $S_2$ illustrated in FIG. 3E. The second highpass filter 140 is assumed to be essentially similar to the first highpass filter 120 in the example. Thus, the remaining interfering signal replicas between each pair of signal of interest replicas are essentially removed leaving the spectrum illustrated in FIG. 3F.

Figure 3G:
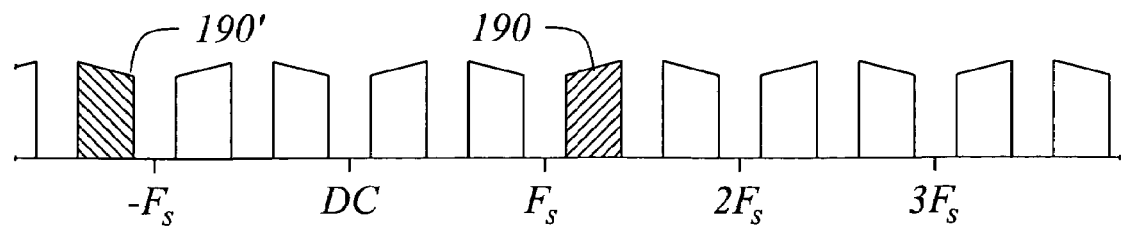
FIG. 3G illustrates a spectrum of a third translated signal produced by a third frequency translator from the second filtered signal illustrated in FIG. 3F.

FIG. 3G illustrates a spectrum of the third translated signal $S_3$ produced by the third frequency translator 150 from the second filtered signal $S'_2$ illustrated in FIG. 3F. For the example, a third frequency shift $f3_d$ equal $f_d$ (e.g., 30 MHz) is assumed. As such, the third translated signal 53 is essentially the second filtered signal $S'_2$ shifted in frequency by $f_d$. In particular, the shifted locations of the signal of interest replicas in the second filtered signal $S'_2$ are shifted up in frequency by $f_d$ (e.g., 30 MHz) (e.g., again, note the shift in location of the crosshatched signal of interest 190 in FIG. 3G relative to FIG. 3F). Thus, the signal of interest replicas are shifted back to a frequency corresponding to that of the input signal $S_{in}$ (e.g., note the location of the crosshatched signal of interest 190 from FIGS. 3B and 3G). The third translated signal $S_3$ then passes through the complex-to-real converter 170 where the complex third translated signal $S_3$ is converted into a real output signal $S_{out}$. In some embodiments, the complex-to-real converter 170 simply discards an imaginary part of the third translated signal $S_3$ leaving the real part. The real output signal $S_{out}$ is the real input signal $S_{in}$ filtered by the digital notch filter 100, thereby removing all of the interfering signal replicas. In some embodiments, the complex-to-real converter 170 is implemented as part of and becomes integral to the third frequency translator 150. In particular, some practical implementations that combine the third frequency translator 150 and the complex-to-real converter 170 may yield circuits having lower complexity.

While a particular shift frequency $f_d$ was employed in the example described hereinabove, such values are nonlimitive, and any number of other shift frequencies and combinations thereof may be employed with a similar effect. In an alternate nonlimitive example, a first shift of minus $f_d$, followed by a second shift of $2f_d$, and followed by a third shift of minus $f_d$ may be used with the digital notch filter 100. In either example, the shift frequency $f_d$ may be chosen to correspond to an offset of the first one of the interfering signal replica pair or an offset of the second one of the interfering signal replica pair. For the examples hereinabove, instead of using a shift frequency $f_d$ equal to 30 MHz, corresponding to the first one of the interfering signal replica of the pair, a shift frequency $f_d$ equal to 26 MHz, corresponding to the second one of the interfering signal replica of the pair, may be used without limitation. In fact, the first shift frequency $f1_d$, the second shift frequency $f2_d$, and the third shift frequency $f3_d$ may be chosen in any manner that ultimately results in both of the interfering signal replicas in a pair being shifted in a manner that results in the removal of the replicas by the stop bands of the highpass filters 120, 140 in accordance with the embodiments of the present invention. In particular, it is within the scope of the embodiments that the shifts chosen need not correspond to offsets within a given pair of interfering signal replicas, as long as both replicas are eventually filtered. Moreover, additional interfering signals may be filtered similarly by adding additional stages of shifting and filtering.

In other embodiments, the highpass filters 120, 140 may be replaced by lowpass filters, essentially converting the digital notch filter 100 to a digital bandpass filter (not illustrated). The digital bandpass filter operates and may be used in a manner analogous (i.e., shift—filter—shift—filter—shift) to that described for the digital notch filter 100 to remove interfering signals. In yet other embodiments, the highpass filters 120, 140 may be replaced by notch filters having stop bands at frequencies other than DC or by bandpass filters with a passband located within a spectral interval. In yet other embodiments, serial and/or parallel combinations of highpass, lowpass, notch, and bandpass filters may replace the highpass filters 120, 140.

In other embodiments, a tracking digital filter is provided. The tracking digital filter is similar to the digital filter 100 except that a feedback or servo loop enables the tracking digital filter to track variations in a frequency of an interfering signal or a signal of interest. For example, by tracking the interfering signal, a rejection thereof by a tracking notch digital filter essentially may be increased or even maximized, depending on the embodiment. Likewise, variations that might be introduced by the digital filter in a signal of interest, as a result of frequency variations therein, may be reduced or even minimized by tracking the signal of interest, depending on the embodiment.

For example, the tracking digital filter may employ a signal generated by one or more of several filters (e.g., the first filter 120 of the digital filter 100) to produce an error or control signal that, in turn, tunes or adjusts a frequency translation $f_d$ of one or more of several frequency translators (e.g., the frequency translators 110, 130, 150 of the digital filter 100). The frequency tuning, using the control signal, essentially acts as a servo loop, such that the error between a frequency of a signal being tracked and a translation frequency $f_d$ of the frequency translators is reduced, or essentially minimized in some embodiments.

Figure 4:
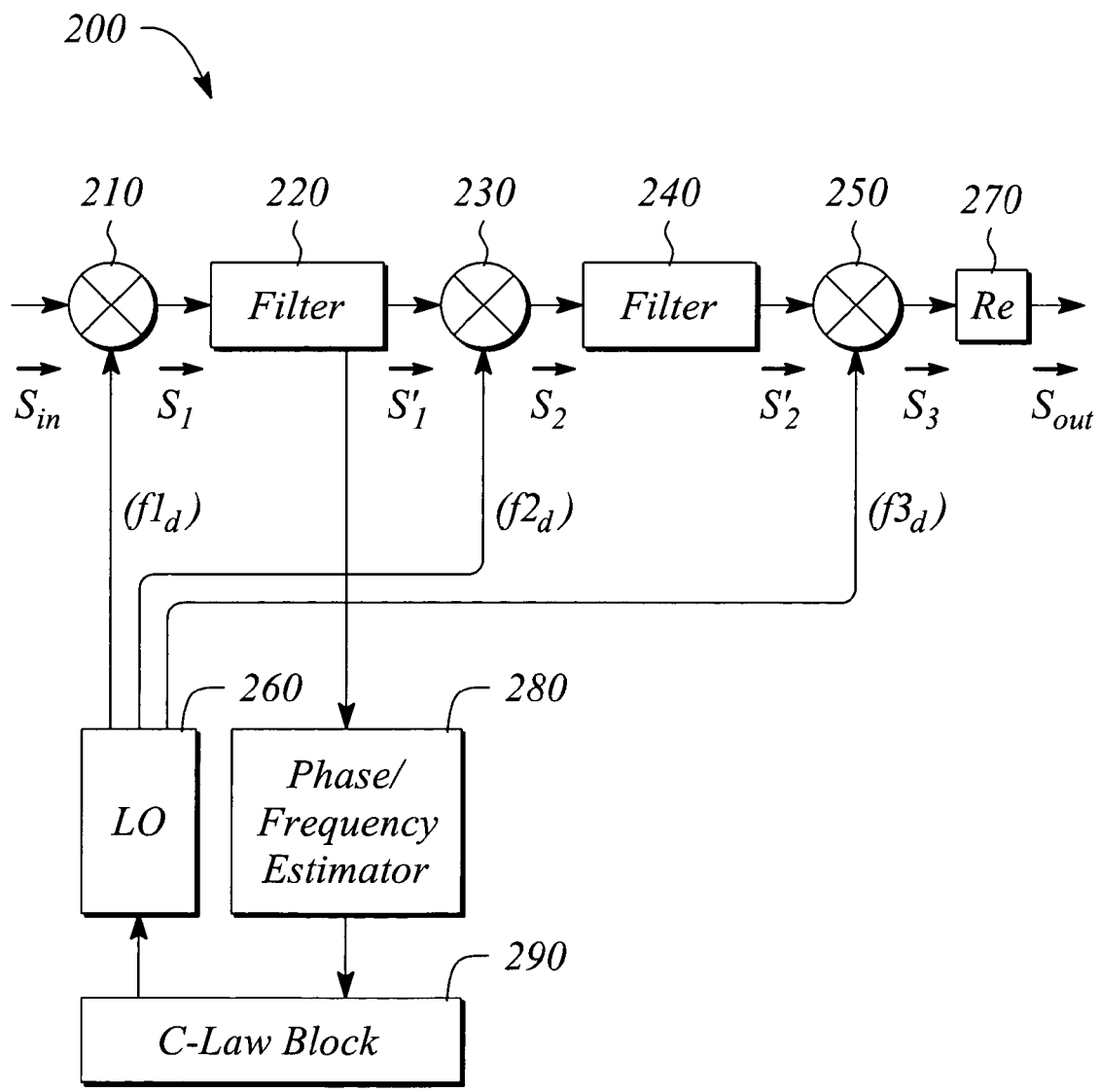
FIG. 4 illustrates a block diagram of a tracking digital notch filter according to an embodiment of the present invention.

FIG. 4 illustrates a block diagram of a tracking digital notch filter 200 according to an embodiment of the present invention. As illustrated in FIG. 4, the tracking digital notch filter 200 is essentially the digital notch filter 100 with a tracking or servo loop added to control a frequency of the local oscillator 160. The tracking digital notch filter 200 operates in a manner that is similar to that described herein above with respect to the digital notch filter 100 except that the tracking digital notch filter 200 may track variations in a frequency of an interfering signal, the variations being a function of time. Thus, the tracking digital notch filter 200 may provide better removal of a time-varying interfering signal than the previously described digital notch filter 100.

The tracking digital notch filter 200 comprises a first frequency translator 210, a first filter 220, a second frequency translator 230, a second filter 240, a third frequency translator 250, a local oscillator (LO) 260, and a complex-to-real converter 270. In some embodiments, the tracking digital notch filter 200 may further comprise a phase/frequency estimator 280 and a control law computational element (hereinafter 'c-law block') 290.

Referring again to FIG. 4, an output of the first frequency translator 210 is connected to an input of the first filter 220, a first output of which (filter 220) is connected to an input of the second frequency translator 230. An output of the second frequency translator 230 is connected to an input of the second filter 240, an output of which (filter 240) is connected to an input of the third frequency translator 250. An output of the third frequency translator 250 is connected to an input of the complex-to-real converter 270. An input of the first frequency translator 210 receives a signal from an input of the tracking digital notch filter 200 while a signal generated by an output of the complex-to-real converter 270 represents an output of the tracking digital notch filter 200.

A first output of the LO 260 is connected to an LO input of the first frequency translator 210. A second output of the LO 260 is connected to an LO input of the second frequency translator 230. A third output of the LO 260 is connected to an LO input of the third frequency translator 250.

A signal produced by a second output of the first filter 220 is employed to generate a control signal for adjusting the tuning of the LO 260 as part of a servo loop or feedback control loop of the tracking digital notch filter 200. In particular, in some embodiments, the second output of the first filter 220 is connected to an input of the phase/frequency estimator 280. An output of the phase/frequency estimator 280 is connected to an input of the c-law block 290. An output of the c-law block is connected to a frequency control input of the LO 260.

The phase/frequency estimator 280 receives the signal produced by the second output of the first filter 220 and determines a phase/frequency of the signal. The determined phase/frequency is communicated to the c-law block 290. The c-law block 290 employs a control law to compute a control signal from the determined phase/frequency. In some embodiments, the control signal represents an error or difference between the determined phase/frequency and a phase/frequency of the LO 260. The control signal, when applied to the control input of the LO 260, results in an adjustment of the LO output signal that essentially reduces, and in some instances, minimizes the error represented by the control signal (e.g., causes the control signal to equal approximately zero).

One skilled in the art will recognize the loop formed by the LO 260, the first frequency translator 220, the second output of the first filter 220, the phase/frequency estimator 280 and the c-law block 290 as being essentially a phase-locked loop acting as a servo loop to control the operation of the LO 260. Other servo loop realizations that act to control the LO 260, as described hereinabove, are known or possible. All such servo loop realizations are within the scope of the present invention.

In some embodiments, the first frequency translator 210, the second frequency translator 230, and the third frequency translator 250 are essentially similar to the first frequency translator 110, the second frequency translator 130, and the third frequency translator 150, respectively, described hereinabove. Likewise, the second filter 240 and the complex-to-real converter 270 may be essentially similar to the second filter 140 and the complex-to-real converter 170, respectively, described hereinabove. For example, the second filter 240 may be a highpass filter having a stop band in a vicinity of DC.

The first filter 220 may be essentially similar to the first filter 120 described hereinabove with respect to the digital notch filter 100, except that the first filter 220 has a second output in addition to the output described hereinabove with respect to the first filter 120. For example, when the first filter 220 is a highpass filter, the second output represents a lowpass filter output of the first filter 220, while the first output represents a highpass filter output. As such, the first filter 220 provides both a highpass output and a lowpass output at the first and second outputs, respectively. Examples of several embodiments of highpass/lowpass filters that may be employed as the first filter 220 are described hereinbelow.

The LO 260 may be essentially similar to the LO 160 described hereinabove with respect to the digital notch filter 100 except that the LO 260 has a tuning or control input. In some embodiments, the control input of the LO 260 receives a control signal that is ultimately generated from the second output signal of the first filter 220. A frequency of the LO 260 is tuned or adjusted by the control signal, thus forming a servo loop.

As discussed hereinabove, the action of the servo loop is to reduce or even minimize an error represented by the control signal, depending on the embodiment. For example, the frequency of the LO 260 may be adjusted by the action of the servo loop to minimize a difference between a frequency of an interfering signal present in an input signal and a first frequency shift of the first frequency translator 210. In other words, the servo loop may act to tune the LO 260 such that the interfering signal is always translated to approximately DC regardless of a frequency variation of the interfering signal. Of course, one skilled in the art will readily recognize that a rate of frequency variation of the interfering signal must be less than a servo loop bandwidth for the tuning to DC to be generally effective.

As with the filters 120 and 140 of the digital filter 100, the filters 220, 240 of the tracking digital filter 200 may be one or more of highpass, lowpass, and bandpass filters. As such, in various embodiments, the tracking digital filter 200 may be a tracking digital notch filter or a tracking digital bandpass filter, as was the case for the digital filter 100. Moreover, a wide variety of filters, both real and complex, may be employed as the filters 220, 240.

Figure 5A:
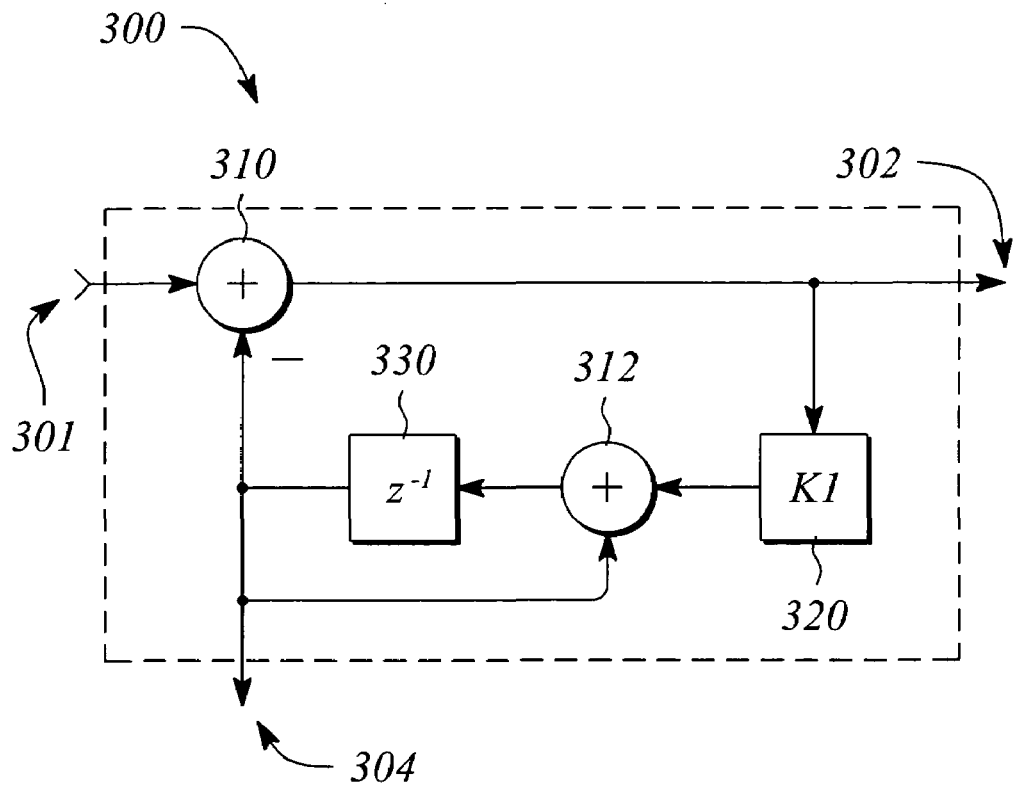
FIG. 5A illustrates a block diagram of an exemplary real, first order, digital filter according to an embodiment of the present invention.

FIG. 5A illustrates a block diagram of an exemplary real, first order, digital filter 300 according to an embodiment of the present invention. The exemplary real, first order, digital filter 300 may be used in implementing one or more of the first filter 110, 210, and the second filter 140, 240 of the digital filter 100, 200 illustrated in FIG. 1, 2 or 4, respectively. In particular, FIG. 5A illustrates the first order digital filter 300 having an input 301 and both of a first output 302 (i.e., highpass output) and a second output 304 (i.e., lowpass output). As such, when employed to implement one or more of the first filter 110, the second filter 140 and the second filter 240, only the first output 302 is used, resulting in a highpass digital filter, for example. Alternatively, when used for the first filter 210, both the first output 302 and the second output 304 are employed, thus producing a highpass/lowpass filter.

Furthermore, as discussed herein above, some embodiments of the digital filters 100, 200 described hereinabove use a pair of real filters arranged in parallel to implement the first and second filters 120, 220, 140, 240. Thus, in using the first order digital filter 300 illustrated in FIG. 5A (i.e., a real filter) in the digital filters 100, 200, implementation of any of the filters 120, 220, 140, 240 generally employs a pair of the real, first order digital filters 300 arranged in parallel. Since employing real filters in parallel, the filters acting on I and Q components, respectively, to filter complex signals, is familiar to one skilled in the art, only the specifics of the real, first order digital filter 300 of the present invention are described hereinbelow.

As illustrated in FIG. 5A, the first order digital filter 300 comprises a first adder 310, a second adder 312, a gain block 320, and a unit delay 330. The input 301 of the digital filter 300 is connected to a first input of the first adder 310. An output of the first adder 310 is connected to both the first output 302 of the digital filter 300 and to an input to the gain block 320. An output of the gain block 320 is connected to a first input of the second adder 312, an output of which (adder 312) is connected to an input of the unit delay 330. An output of the unit delay 330 is connected to a second input of the first adder 310, to a second input of the second adder 312, and to the second output 304 of the digital filter 300.

The first adder 310 and the second adder 312 are digital adders. In particular, each of the first and second adders 310, 312, add together or sum digital signals present at respective first and second inputs to produce an output digital signal or data value. In a manner consistent with conventional block diagram notation, a minus sign (−) at the second input of the first adder 310 indicates that the sum is actually a difference (i.e., subtraction). That is, the presence of the minus sign in FIG. 5A indicates that the first adder 310 actually subtracts (i.e., "negative sums") the digital signal present at the second input from that present at the first input of the first adder 310.

The gain block 320 is a multiplier that multiplies a digital signal present at the input by a filter constant K1 of the first order digital filter 300. The unit delay 330 delays a digital signal present at the input thereof by one time unit of the digital signal. In some embodiments, each of the adders 310, 312, the gain block 320, and the unit delay 330 are conventional components of digital filters familiar to those skilled in the art.

A digital transfer function of the first order digital filter 300 illustrated in FIG. 5A is given by $$H(z) = \frac{1-z^{-1}}{1+(K1-1)z^{-1}} \text{ and} \quad (1)$$

$$L(z) = \frac{K1z^{-1}}{1+(K1-1)z^{-1}} \quad (2)$$

where H(z) is the digital transfer function from the input 301 to the first or highpass output 302 and L(z) is the digital transfer function from the input 301 to the second or lowpass output 304.

In some embodiments, the first order digital filter 300 may represent a digital approximation of a conventional Butterworth analog prototype filter. As such, the first order digital filter 300 may be approximately a first order Butterworth filter. For example, a transformation of the analog prototype into the digital filter 300 may be accomplished using the "Mapping of Differentials" method, a description of which is available in many textbooks including, but not limited to, that by Lawrence R. Rabiner and Bernard Gold entitled *Theory and Application of Digital Signal Processing*, Prentice-Hall, Inc., Englewood Cliffs, N.J., 1975, incorporated herein by reference.

Figure 5B:
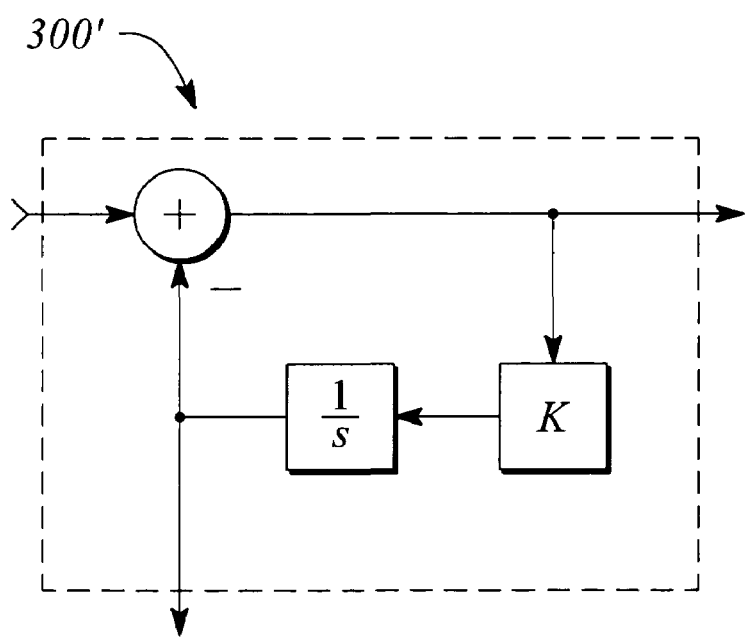
FIG. 5B illustrates a block diagram of a Butterworth analog prototype filter familiar to those skilled in the art.

FIG. 5B illustrates a block diagram of the Butterworth analog prototype filter 300' familiar to those skilled in the art. The conventional Butterworth analog prototype filter 300' illustrated in FIG. 5B has an analog filter constant K equal to a 3 dB cut-off frequency $\omega_{3dB}$ (radians per second) of the analog filter 300'. When the first order Butterworth analog filter 300' is mapped into a digital approximation, the first order digital filter constant K1 is given approximately in terms of the analog filter constant K and the sample rate or sample frequency $F_s$ of the digital signal. In particular, the first order filter constant K1, in terms of the sampling frequency $F_s$ of the digital signal and a cut-off bandwidth $\omega_n$ of the digital filter, is given by the approximation $$K1 \approx \frac{\omega_n}{F_s} \quad (3)$$

In some embodiments of the digital filter 300, the first order filter constant K1 may be further constrained such that the constant K1 is equal to a fractional factor of two. In particular, by selectively choosing the cut-off bandwidth $\omega_n$ with respect to the sampling frequency $F_s$, the product in equation (3) can be made to be equal to $2^{-m}$, where m is a positive integer according to these embodiments. In such embodiments of the digital filter 300, the gain block 320 may be realized as a digital shifter (e.g., shift register) rather than a general-purpose multiplier. For example, if the 3 dB bandwidth $\omega_{3dB}$, for a given sampling frequency $F_s$, is chosen such that the value of the filter constant K1 is equal to $2^{-6}$ (i.e., m=6), the gain block 320 may be realized by shifting the value of the digital signal in a negative direction by six bits.

In general, digital shifters may be implemented at much higher speeds for a given technology than general-purpose multipliers. Thus, by employing the Butterworth prototype and constraining the bandwidth, such that the filter constant K1 is a factor of two, the first order digital filter 300 of the present invention may process higher data rate signals (i.e., handle higher sampling frequencies $F_s$) by using a digital shifter instead of a multiplier for the gain block 320 as in conventional filters. In essence, the first order digital filter 300 may be implemented without an explicit multiply (i.e., without using a multiplier having an arbitrary multiplier) under such circumstances in accordance with the present invention.

Examples of technologies used for implementing components of the digital filter 300, such as the gain block 320 implemented as a digital shifter in accordance with these embodiments of the digital filter 300, include, but are not limited to, application specific integrated circuits (ASICs), field programmable gate arrays (FPGAs), digital signal processing engines, and digital signal processing software running on a general purpose computer or microprocessor.

Figure 6A:
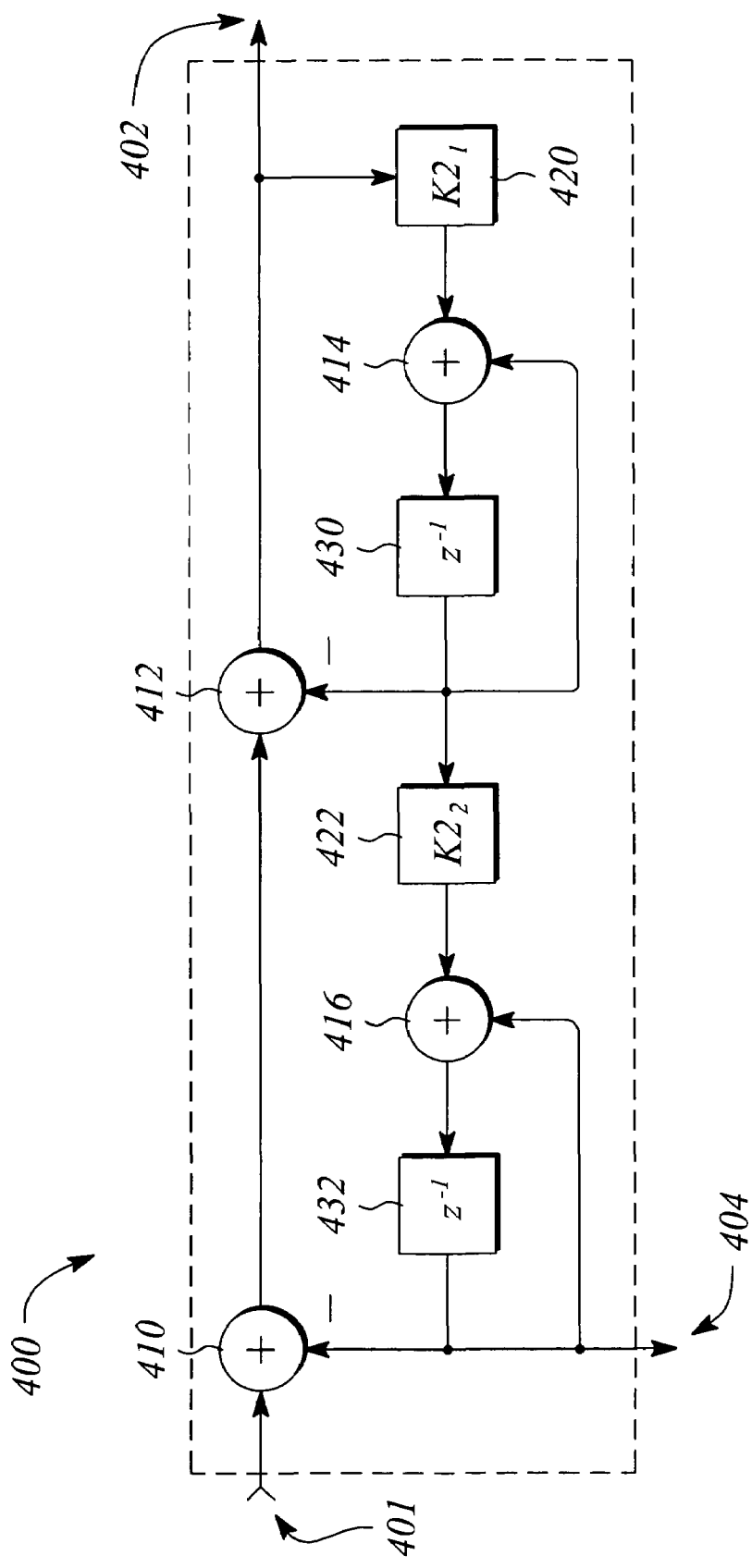
FIG. 6A illustrates a block diagram of an exemplary real, second order, digital filter according to an embodiment of the present invention.

In some embodiments, one or more of the first filters 110, 210 and the second filters 140, 240 of the digital filters 100, 200 illustrated in FIG. 1, 2 or 4, respectively, may employ a second order filter or pair of second order filters. FIG. 6A illustrates a block diagram of an exemplary real, second order, digital filter 400 according to an embodiment of the present invention. As with the first order digital filter 300, the exemplary second order digital filter 400 illustrated in FIG. 6A has an input 401 and provides both a first or highpass output 402 and a second or lowpass output 404. Similarly, in some embodiments, the second order digital filter 400 may be based on or derived from a conventional second order analog Butterworth filter prototype using, for example, the aforementioned "Mapping of Differentials" method.

Figure 6B:
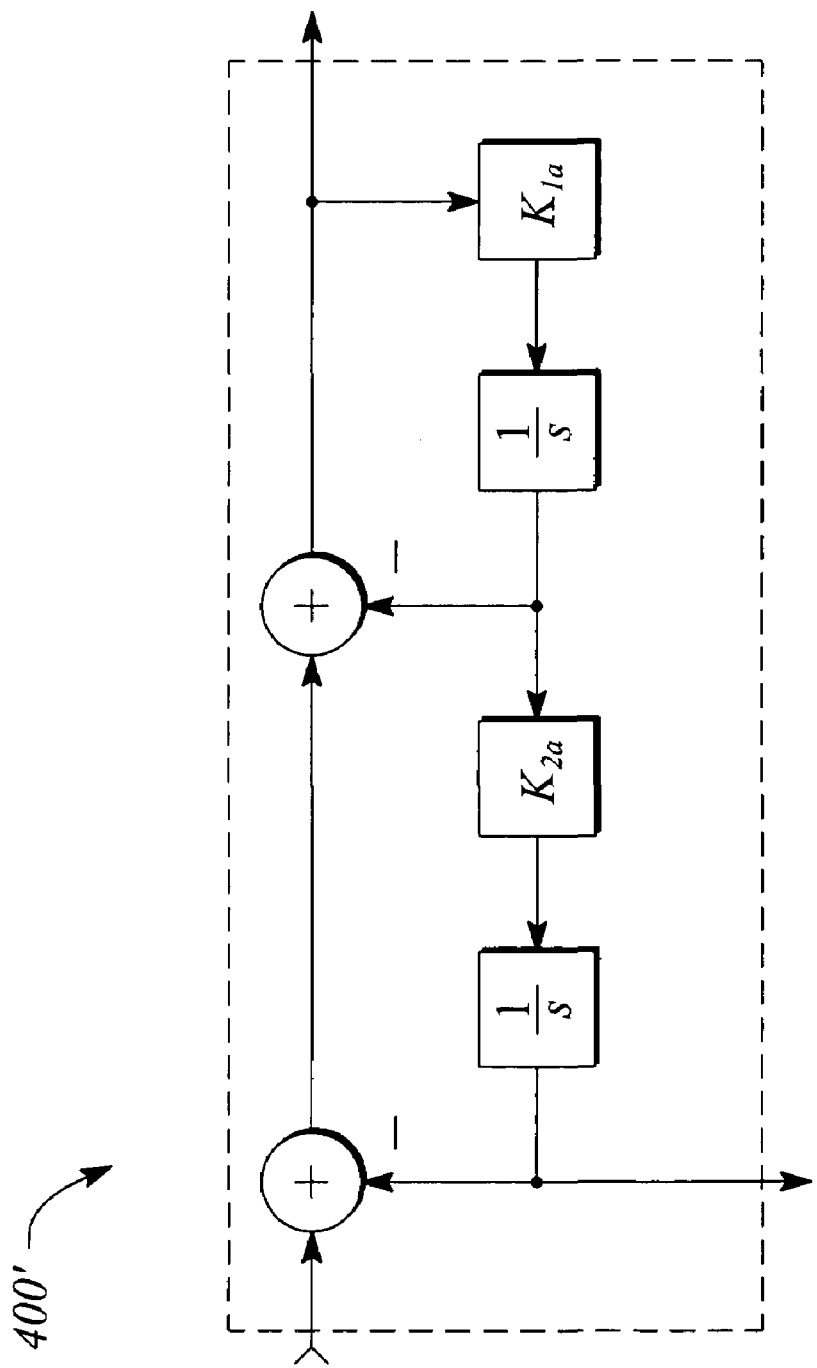
FIG. 6B illustrates a block diagram of a conventional second order analog filter prototype.

FIG. 6B illustrates a block diagram of a conventional second order analog filter prototype 400'. A second order analog filter prototype 400' having a Butterworth profile is characterized by a specific relationship between the pair of analog filter coefficients $K_{1\alpha}$ and $K_{2\alpha}$ of the filter prototype 400'. In general, the analog filter coefficients for the Butterworth prototype, in terms of the filter cut-off frequency $\omega_n$, are characterized by $$\omega_n^2 = K_{1\alpha} K_{2\alpha}$$

$$K_{1\alpha} = \sqrt{2}\omega_n \quad (4)$$

Under such conditions, the relationship between the coefficients may be shown to be $$K_{1\alpha} = 2K_{2\alpha} \quad (5)$$

Mapping the analog filter coefficients above into a digital approximation yields a corresponding pair of digital filter coefficients $K2_1$ and $K2_2$ given by $$K2_2 = K_f \approx \frac{\omega_n}{F_s\sqrt{2}} \quad (6)$$

$$K2_1 = 2K_f \approx \frac{\sqrt{2}\,\omega_n}{F_s}$$

where $F_s$ is the sampling frequency of the digital signal as before.

Referring again to FIG. 6A, the second order digital filter 400 comprises a first adder 410, a second adder 412, a first gain block 420, a third adder 414, a first unit delay 430, a second gain block 422, a fourth adder 416, and a second unit delay 432. The input 401 of the digital filter 400 is connected to a first input of the first adder 410. An output of the first adder 410 is connected to a first input of the second adder 412, an output of which (adder 412) is connected to both a first output 402 of the second order digital filter 400 and to an input of the first gain block 420. An output of the first gain block 420 is connected to a first input of the third adder 414, an output of which (adder 414) is connected to an input of the first unit delay 430. An output of the first unit delay 430 is connected to each of a second input of the third adder 414, an input of the second gain block 422, and a second input of the second adder 412. An output of the second gain block 422 is connected to a first input of the fourth adder 416, an output of which (adder 416) is connected to an input of the second unit delay 432. An output of the second unit delay 432 is connected to each of a second input of the first adder 410, to a second input of the fourth adder 416, and to the second output 404 of the second order digital filter 400.

As with the block diagrams of FIGS. 5A and 5B, a minus sign (−) at the second input of an adder (e.g., the first and second adders 410, 412 in FIG. 6A) indicates that the sum is actually a difference. Thus, the first and second adders 410, 412 subtract (i.e., "negative sum") the digital signal present at respective ones of the second inputs from that present at respective ones of the first inputs. But for the additional components, the operation of the second order digital filter 400 is much as was described for the first order digital filter 300. In particular, the second order digital filter 400 implements both a highpass digital transfer function H(z) and a lowpass digital transfer function L(z) given by $$H(z) = \frac{(1-z^{-1})^2}{1 + 2(K_f - 1)z^{-1} + (2K_f^2 - 2K_f + 1)z^{-2}} \text{ and} \quad (7)$$

$$L(z) = \frac{2K_f z^{-1}(1 + (K_f - 1)z^{-1})}{1 + 2(K_f - 1)z^{-1} + (2K_f^2 - 2K_f + 1)z^{-2}} \quad (8)$$

where H(z) is the digital transfer function from the input 401 to the first or highpass output 402 and L(z) is the digital transfer function from the input 401 to the second or lowpass output 404 of the second order digital filter 400.

Also, the second order digital filter 400 derived from an analog Butterworth prototype, as described herein according to some embodiments, may be implemented with digital shifters in some of these embodiments instead of general-purpose multipliers for the gain blocks 420, 422 as in conventional filters. In particular, by judicious constraint on selecting the cut-off frequency $\omega_n$, given a particular sampling frequency $F_s$, the digital filter coefficients $K2_1$ and $K2_2$, may be made equal to fractional powers of two (e.g., $K_f=2^{-n}$) according to these embodiments, thereby enabling higher speed implementations than would result from other such choices. In essence, as with the first order digital filter 300, the second order digital filter 400 may be implemented without explicit multiplies under such circumstances by using digital shifters instead of multipliers for the first and second gain blocks 420, 422 in accordance with these embodiments of the digital filter 400 of the present invention.

Figure 6C:
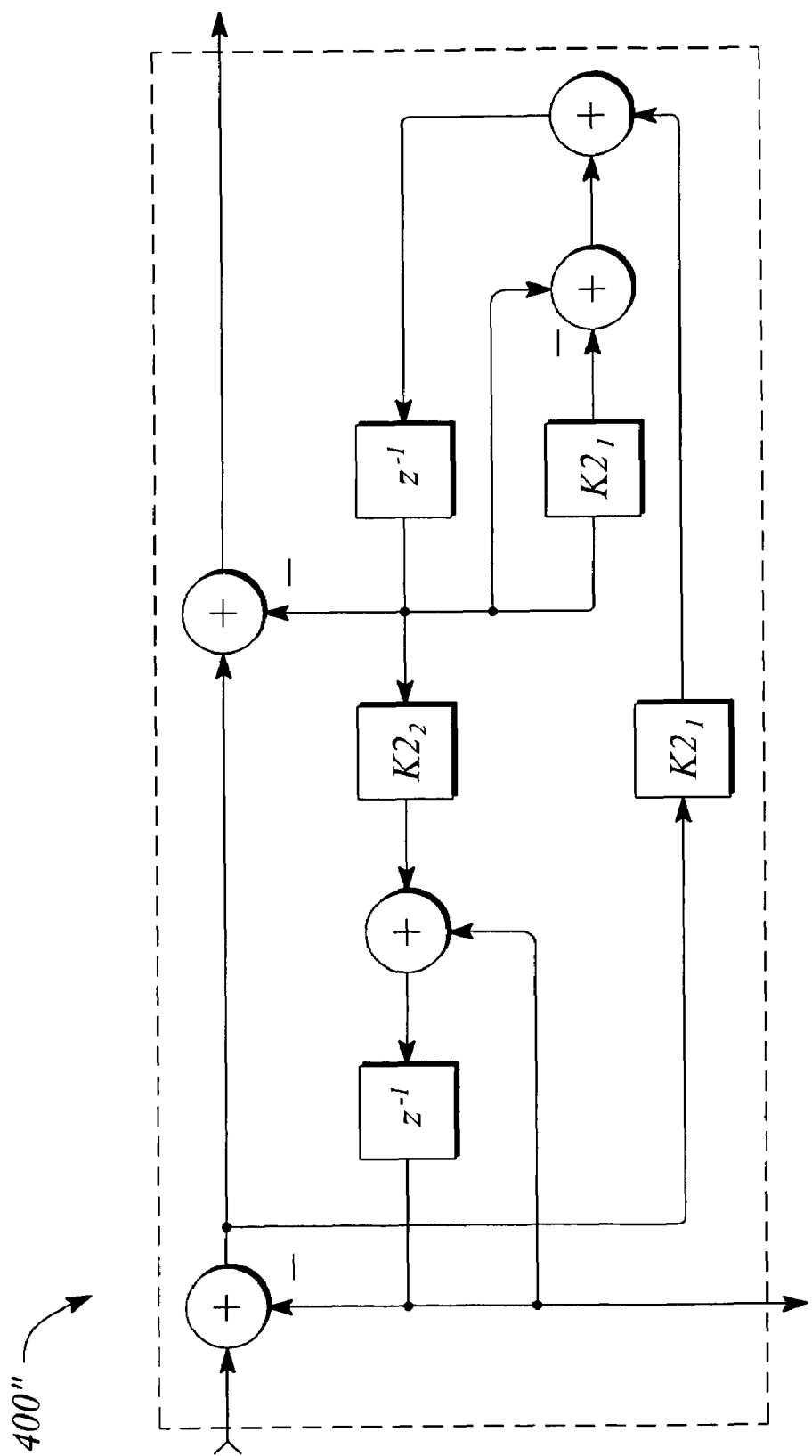
FIG. 6C illustrates a block diagram of another exemplary second order digital filter according to an embodiment of the present invention.

FIG. 6C illustrates a block diagram of another exemplary second order digital filter 400" according to an embodiment of the present invention. In particular, the second order digital filter 400" illustrated in FIG. 6C may have the same digital transfer function and use the same filter coefficients, as were described for the second order digital filter 400 illustrated in FIG. 6A. The filter 400" structure illustrated in FIG. 6C may have certain practical implementation advantages compared to that illustrated in FIG. 6A. For example, the digital filter 400" structure of FIG. 6C uses only two levels of adders between storage registers (i.e., unit delays), as compared to the three levels of adders 410, 412, 414, 416 between unit delays 430, 432 employed in FIG. 6A.

Figure 7:
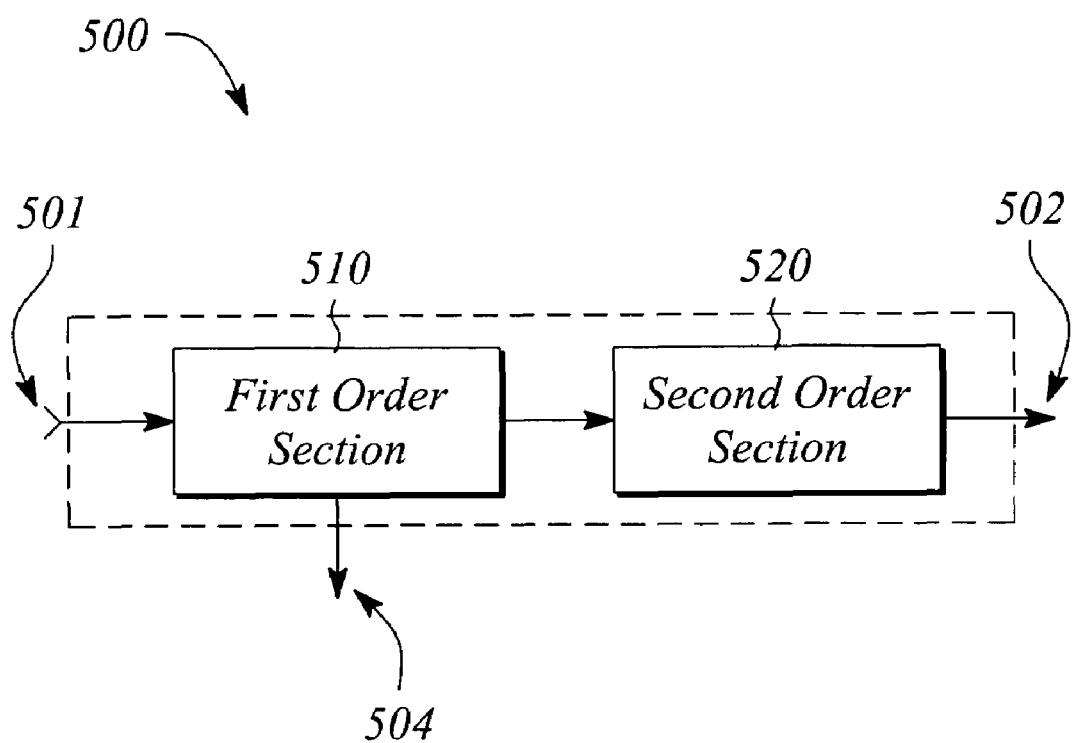
FIG. 7 illustrates a block diagram of an exemplary real, third order, digital filter according to an embodiment of the present invention.

In yet other embodiments of the digital filters 100, 200 illustrated in FIGS. 1, 2 and 4, respectively, one or more of the first filters 110, 210 and the second filters 140, 240 may employ a third order filter or pair of third order filters. FIG. 7 illustrates a block diagram of an exemplary real, third order, digital filter 500 according to an embodiment of the present invention. In some embodiments, the third order digital filter 500 comprises a first order section 510 and a second order section 520, the sections being arranged in series with one another. Note that the ordering of the two sections is irrelevant according to these embodiments of the digital filter 500 of the present invention such that the first order section 510 may either precede or follow the second order section 520. Moreover, in some embodiments of the digital filter 500, the first order section 510 is realized using any of the embodiments described above for the first order digital filter 300, 300' and the second order section 520 is realized using any of the embodiments described above for the second order digital filter 400, 400', 400" described hereinabove.

In an embodiment of the real, third order, digital filter 500, the digital filter 500 is implemented as a third order Butterworth filter that uses the first order digital filter 300 as the first order section 510. A filter coefficient of a gain block of the first order section 510 (i.e., equivalent to the gain block 320 of the digital filter 300) is the same as that for the filter coefficient K1 of the first order digital filter 300. Namely, the first order section filter coefficient is given by $$K1_1 \approx \frac{\omega_n}{F_s} \quad (3)$$

The second order section 520 of the digital filter 500 is implemented as the second order digital filter 400. In particular, when a third order Butterworth Polynomial is factored into a first-order/second-order cascade, the first and second filter coefficients, $K2_1$ and $K2_2$, are found to equal one another and have the same value as $K1_1$. Thus, for this embodiment of the third order Butterworth filter approximation, the coefficients are $$K1_1 = K2_1 = K2_2 = \frac{\omega_n}{F_s} \quad (6)$$

As with the first and second order filters discussed hereinabove, judicious choice of the cutoff frequency may allow the coefficients to be negative powers of 2 thereby providing to the third order filter the speed and implementation benefits previously noted for some embodiments of the digital filters 300, 400, 400', 400" of the present invention. Moreover, the exemplary embodiment of the digital filter 400" of FIG. 6C may be employed to achieve even higher speeds than conventional achieved with analog or digital filters.

As with the first and second order digital filters 300, 400, the exemplary third order digital filter 500 illustrated in FIG. 7 has an input 501 and provides both a first or highpass output 502 and a second or lowpass output 504. In principle, while either the first order section 510 or the second order section 520 may be used to produce the lowpass output 504, only the section 510, 520, closest to the input 501 is generally employed therefor. For example, as illustrated in FIG. 7, the lowpass output 504 is provided by a lowpass output of the first order section 510 (e.g., the lowpass output 304 of the digital filter 300, 300'), since in this embodiment, the first order section 510 is closer to the input 501 than the second order section 520.

Figure 8:
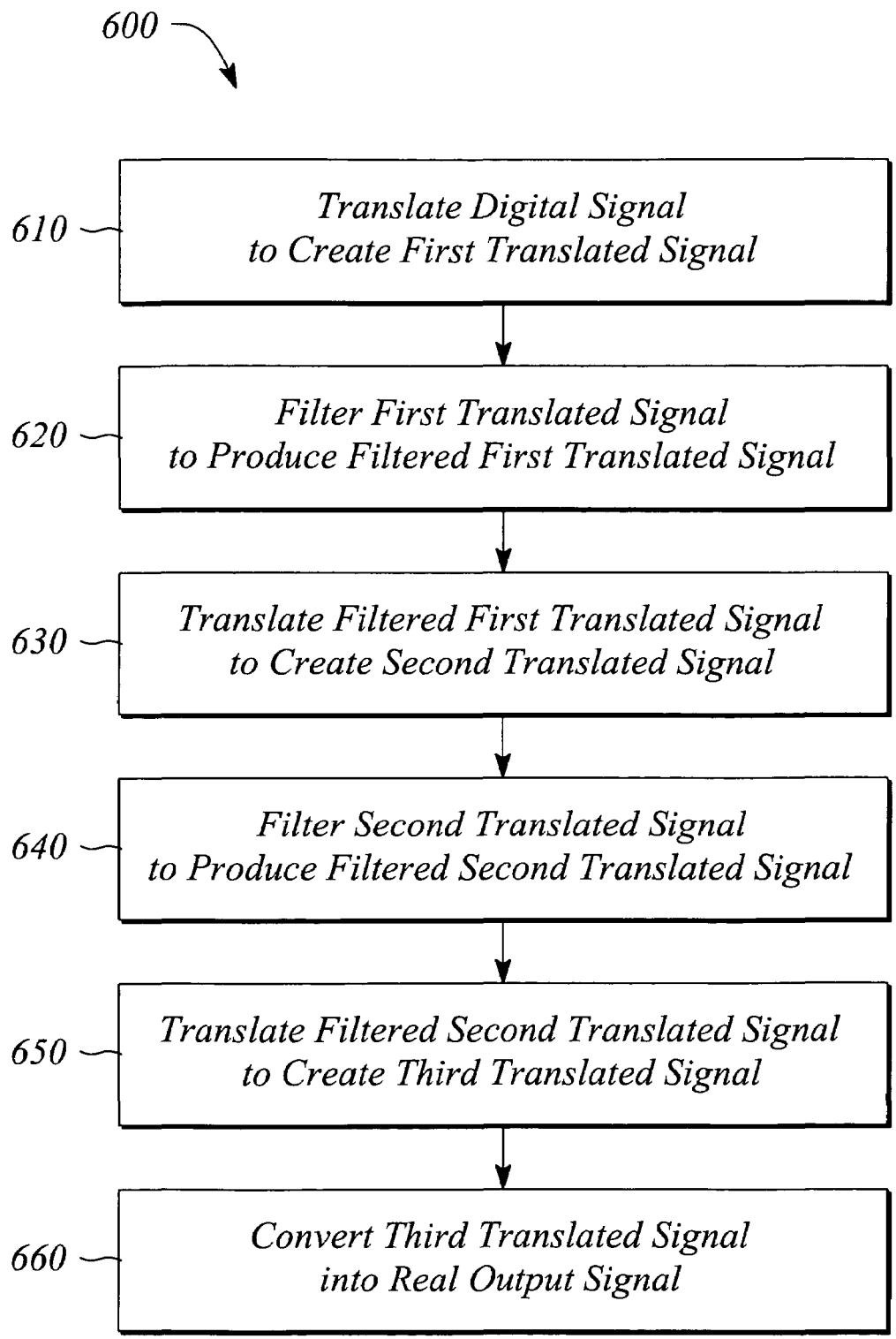
FIG. 8 illustrates a flow chart of a method of filtering a digital signal using frequency translations according to an embodiment of the present invention.

FIG. 8 illustrates a flow chart of a method 600 of filtering a digital signal using frequency translations according to an embodiment of the present invention. The method of filtering 600 comprises frequency translating 610 an input signal to create a first translated signal. In some embodiments, translating 610 shifts in frequency a spectrum of the input signal by a first shift frequency. As such, the first translated signal is simply the input signal shifted in frequency by an amount equal to the first frequency shift.

The input signal is a digital signal and may be either a real signal or a complex signal. The first translated signal is a complex digital signal. The first frequency shift may represent a positive frequency shift or a negative frequency shift. In some embodiments, frequency translating 610 comprises multiplying the input signal by a complex exponential or a digitized representation thereof.

A positive frequency shift is produced by multiplication when an exponent of the complex exponential is positive-valued while a negative frequency shift results when the complex exponential has a negative-valued exponent. In general, 'multiplying' herein refers to complex multiplication unless otherwise specified.

The method of filtering 600 further comprises filtering 620 the first translated signal to produce a filtered, first translated signal. In some embodiments, filtering 620 comprises passing the first translated signal through a highpass filter. Passing a signal through a highpass filter is referred to hereinafter as 'highpass filtering'. In other embodiments, filtering 620 comprises passing the first translated signal through a lowpass filter. Passing a signal through a lowpass filter is referred to hereinafter as 'lowpass filtering'. In yet other embodiments, filtering 620 comprises passing the first translated signal through a plurality of filters connected in parallel and/or in series, the plurality including, but not limited to, one or more of highpass filters, lowpass filters, notch filters, and bandpass filters.

The method of filtering 600 further comprises frequency translating 630 the filtered, first translated signal to create a second translated signal. In some embodiments, translating 630 shifts in frequency a spectrum of the filtered, first translated signal by a second shift frequency. As such, the second translated signal is essentially the filtered, first translated signal shifted in frequency by an amount equal to the second frequency shift. The second frequency shift may represent either a positive frequency shift or a negative frequency shift. In some embodiments, frequency translating 630 comprises multiplying the filtered, first translated signal by a complex exponential or a digitized representation thereof. In some embodiments, the second translated signal is a complex signal.

In some embodiments, the method of filtering 600 further comprises filtering 640 the second translated signal to produce a filtered, second translated signal. In some of these embodiments, filtering 640 comprises highpass filtering the second translated signal. In other embodiments, filtering 640 comprises lowpass filtering the second translated signal. In yet other embodiments, filtering 640 comprises passing the second translated signal through a plurality of filters connected in parallel and/or in series, the plurality including, but not limited to, one or more of highpass filters, lowpass filters, notch filters, and bandpass filters.

In some embodiments, the method 600 of filtering a digital signal using frequency translations further comprises frequency translating 650 the filtered, second translated signal to create a third translated signal. In some of these embodiments, translating 650 shifts in frequency a spectrum of the filtered, second translated signal by a third shift frequency. As such, the third translated signal is essentially the filtered, second translated signal shifted in frequency by an amount equal to the third frequency shift. The third frequency shift may represent either a positive frequency shift or a negative frequency shift. In some embodiments, frequency translating 650 comprises multiplying the filtered, second translated signal by a complex exponential or a digitized representation thereof. In some embodiments, the third translated signal is a complex signal.

In some embodiments, the method 600 of filtering a digital signal using frequency translations further comprises converting 660 the third translated signal into a real signal. In some embodiments, the method 600 may optionally comprise adjusting a shift amount of one or more of the first, second and third shift frequencies to correspond to a variation in a frequency of a signal component of the input signal. For example, the shift amount may be adjusted to correspond to a time variation of a frequency of a narrowband signal present in the input signal.

In some embodiments, the method 600 of filtering a digital signal using frequency translations provides notch or bandstop filtering of the input signal. Such notch filtering may reduce or essentially remove an interfering signal while minimally degrading a signal of interest within the input signal.

For example, during translating 610, the first frequency shift may correspond to a frequency of an interferer or a frequency of an image of the interferer in the input signal. During translating 630, the second frequency shift then, may be equal to a negative of two times the first frequency shift, while during translating 650, the third frequency shift may be equal to the first frequency shift. Furthermore, in this example, highpass filtering 620, 640 may be employed to remove signal components in a vicinity of DC. This example is non-limitive herein and other frequency shifts for translating 610, 630, 650 and other filtering 620, 640 scenarios according to the method 600 that may be devised by those skilled in the art are within the scope of the method of filtering 600 according to the present invention. As such, in the example, the method 600 selectively removes the interferer from the input signal while preserving both the signal of interest and a spectral frequency orientation and location thereof and further, the method 600 essentially provides notch filtering of the input signal to remove the interferer.

Thus, there has been described various embodiments of the present invention that facilitate digital filtering of a digital signal using frequency translations. It should be understood that the above-described embodiments are merely illustrative of some of the many specific embodiments that represent the principles of the present invention. Those skilled in the art can readily devise numerous other arrangements without departing from the scope of the present invention.

What is claimed is:

1. A digital filter that filters a digital input signal comprising:
   a first frequency translator that frequency shifts the digital input signal to produce a first translated signal;
   a first digital filter that attenuates frequency components in the first translated signal to produce a filtered first translated signal; and
   a second frequency translator that frequency shifts the filtered first translated signal to produce a second translated signal,
   wherein the first filter is centered approximately at direct current (DC).

2. The digital filter of claim 1, wherein the first frequency translator shifts the digital input signal by a first shift frequency and the second frequency translator shifts the filtered first translated signal by a second shift frequency.

3. The digital filter of claim 1, wherein the first filter comprises one or more constituent filters, the constituent filters being independently selected from a highpass filter and a lowpass filter.

4. The digital filter of claim 1, further comprising:
   a second digital filter that attenuates frequency components in the second translated signal to produce a filtered second translated signal; and
   a third frequency translator that shifts the filtered second translated signal to produce a third translated signal before being applied to an output signal to an output port of the digital filter, wherein the first frequency translator shifts the digital input signal by a first shift frequency, the second frequency translator shifting the filtered first translated signal by a second shift frequency, the third frequency translator shifting the filtered second translated signal by a third shift frequency.

5. The digital filter of claim 4, wherein a sum of the first shift frequency, the second shift frequency, and the third shift frequency is equal to zero, such that the third translated signal is returned to a spectral condition of the digital input signal but for filtering by the first filter and the second filter.

6. The digital filter of claim 4, wherein the first frequency translator, the first digital filter, and the second frequency translator comprise at least one electrical circuit.

7. The digital filter of claim 4, wherein each of the first filter and the second filter independently comprises one or more constituent filters, the constituent filters being independently selected from a highpass filter and a lowpass filter.

8. The digital filter of claim 4, wherein both the first filter and the second filter are highpass filters, and wherein the first shift frequency corresponds to a frequency difference between a first frequency component to be filtered and zero frequency of direct current (DC), and wherein the second shift frequency corresponds to a frequency difference between a second frequency component to be filtered and DC, the digital filter implementing a bandstop filter and providing selective attenuation of the first frequency component and the second frequency component.

9. The digital filter of claim 4, wherein both the first filter and the second filter are lowpass filters, the digital filter implementing a bandpass filter.

10. The digital filter of claim 4, wherein one or more of the input signal, the first translated signal, the second translated signal, the third translated signal and the output signal is selected from a complex signal and a real signal.

11. The digital filter of claim 4, further comprising:
a complex-to-real converter having an output connected to the output port of the digital filter, the converter transforming a complex signal to a real signal that is applied as the output signal to the digital filter output port.

12. The digital filter of claim 4, further comprising:
a complex local oscillator (LO) having an output connected to a LO input of each of the first frequency translator, the second frequency translator, and the third frequency translator, the complex local oscillator providing a respective shift frequency to each frequency translator that dictates a corresponding frequency shift in the produced translated signal; and
a complex-to-real converter that produces a real signal from the third translated signal at the output port of the digital notch filter.

13. The digital filter of claim 12, further comprising a feedback or servo loop connected between the first filter and the complex local oscillator that enables the digital filter to track variations in a frequency of a signal component of the input signal.

14. A digital notch filter that removes an interfering signal from a signal of interest comprising:
a plurality of frequency translators, each translator of the plurality having a signal input and a signal output, the signal input of a first translator of the plurality of frequency translators being connected to an input port of the digital notch filter;
a plurality of digital filters, a first filter of the plurality of the digital filters being connected between the signal output of the first translator and the signal input of a second frequency translator, a second digital filter being connected between the signal output of the second translator and the signal input of a third frequency translator; a complex local oscillator (LO) having an output connected to an LO input of each translator of the plurality of frequency translators; and
a complex-to-real converter connected between an output of the third translator and an output.

15. The digital notch filter of claim 14, wherein each translator of the plurality of frequency translators is a complex multiplier that multiplies a signal at the signal input by a respective shift frequency to produce a translated signal at the signal output having a shifted spectrum, the complex local oscillator applying the respective shift frequencies to the LO input of each translator.

16. The digital notch filter of claim 15, wherein the translated signal at the signal output of the third translator is returned to a spectral condition of the signal of interest at the signal input of the first translator but for filtering by the plurality of digital filters.

17. The digital notch filter of claim 15, wherein a first shift frequency at the LO input of the first translator is equal in magnitude and sign to a third shift frequency at the LO input of the third translator, a second shift frequency at the LO input of The second translator being double in magnitude and opposite to sign relative to the first shift frequency.

18. The digital notch filter of claim 15, wherein each filter of the plurality of digital filters removes the interfering signal from a different shifted spectrum.

19. The digital notch filter of claim 14, wherein the plurality of frequency translators and the plurality of digital fitters comprise at least one electrical circuit.

20. The digital notch filter of claim 14, wherein each filter of the plurality of digital filters is selected from one or more highpass filters, the highpass filter accepting a complex translated signal at a filter input and producing a filtered complex translated signal at a filter output.

21. The digital notch filter of claim 14, wherein each filter of the plurality of digital filters is selected from one or more of a highpass filter and a lowpass filter, the highpass filter having a stop band extending from approximately zero frequency or direct current (DC) to a cut-off frequency, the bandpass filter having a passband extending from DC to a cut-off frequency.

22. The digital notch filter of claim 14, wherein the complex local oscillator comprises:
a numerically controlled oscillator (NC 0) having an output that is connected to each of a first output and a third output of the complex local oscillator, the first output and the third output being connected to the respective LO inputs of the first translator and the third translator of the plurality of frequency translators;
a complex conjugator having an output connected to a second output of the complex local oscillator; and
a complex squaring circuit connected between the output of the NCO and an input of the complex conjugator.

23. The digital notch filter of claim 22, wherein the NCO generates a complex digital signal, the complex squaring circuit multiplying the complex digital signal produced by the NCO by itself to produce a squared signal, the complex conjugator computing a complex conjugate of the squared signal to produce a complex conjugate signal.

24. The digital notch filter of claim 23, wherein the local oscillator provides the complex conjugate signal to the LO input of the second translator and the complex digital signal to the LO inputs of the first translator and the third translator.

25. The digital notch filter of claim 14, further comprising a feedback or servo loop connected between the first filter and the local oscillator, the loop controlling a frequency of the local oscillator, such that the digital notch filter tracks frequency variations in the interfering signal or the signal of interest.

26. The digital notch filter of claim 25, wherein the loop comprises a phase/frequency estimator connected to an output of the first filter, and a control law computational (c-law) element connected between an output of the estimator and an input of the local oscillator.

27. The digital notch filter of claim 25, wherein the loop generates a control signal from a determined phase/frequency of a signal from the first filter, the control signal representing a difference between the determined phase/frequency and a phase/frequency of the local oscillator that is reduced by the local oscillator.

28. The digital notch filter of claim 14, wherein one or both of the first filter and the second filter is selected from a first order digital filter that implements a digital approximation of a first order analog Butterworth filter, a second order digital filter that implements a digital approximation of a second order analog Butterworth filter, and a third order digital filter that implements a digital approximation of a third order analog Butterworth filter.

29. The digital notch filter of claim 28, wherein one or more multipliers of one or both of the first filter and the second filter are digital shifters instead of explicit arbitrary digital multipliers.

30. The digital notch filter of claim 28, wherein the third order digital filter comprises a first section and a second section, the first section comprising one of the first order digital filter and the second order digital filter and the second section independently comprising one of the first order digital filter and the second order digital filter.

31. A method of filtering a digital signal using frequency translations comprising:
    frequency translating a digital input signal to create a first translated signal that is a complex signal;
    filtering the first translated signal to produce a filtered first translated signal; and
    frequency translating the filtered first translated signal to create a second translated signal,
    wherein filtering is centered approximately at direct current (DC).

32. The method of filtering of claim 31, wherein frequency translating the respective signals shifts corresponding spectra of the respective signals by a respective shift frequency, a spectrum of the filtered second translated signal being returned to a spectrum of the digital input signal but for filtering.

33. The method of filtering of claim 32, further comprising:
    adjusting a shift amount of one or more of the respective shift frequencies to correspond to a variation in a frequency of a signal component of the digital input signal.

34. The method of filtering a claim 31, further comprising:
    filtering the second translated signal to produce a filtered second translated signal;
    frequency translating the filtered second translated signal to create a third translated signal; and
    converting the third translated signal from a complex signal to a real signal.

35. The method of filtering of claim 34, wherein a sum of the respective shift frequencies is equal to zero, such that a spectrum of the third translated signal is the spectrum of the digital input signal but for filtering.

36. The method of filtering of claim 34, wherein translating the digital input signal comprises shifting a spectrum of the input signal by a first shift frequency, translating the filtered first translated signal comprises shifting the spectrum of the input signal after filtering by a second shift frequency, translating the filtered second translated signal by a third shift frequency, wherein the first shift frequency and the third shift frequency are equal in magnitude and sign, the second shift frequency being twice the magnitude and opposite in sign relative to the first shift frequency.

37. The method of filtering of claim 31, wherein each filtering of a respective translated signal comprises using one or more of a highpass filter and a lowpass filter.

38. The method of filtering of claim 31, further comprising employing an electrical circuit to perform the frequency translating and filtering steps.

* * * * *

UNITED STATES PATENT AND TRADEMARK OFFICE
CERTIFICATE OF CORRECTION

PATENT NO. : 7,395,290 B2 Page 1 of 1
APPLICATION NO. : 10/861867
DATED : July 1, 2008
INVENTOR(S) : Moore It is certified that error appears in the above-identified patent and that said Letters Patent is hereby corrected as shown below:

On the title page, item (57), under "Abstract", in column 2, line 4, delete "fitter" and insert -- filter --, therefor.

In column 20, line 66, in Claim 4, after "applied" delete "to an" and insert -- as an --, therefor.

In column 21, line 23, in Claim 8, after "frequency" delete "of" and insert -- or --, therefor.

In column 21, line 64, in Claim 14, after "the plurality of" delete "the".

In column 22, line 24, in Claim 17, delete "The" and insert -- the --, therefor.

In column 22, line 25, in Claim 17, delete "to sign" and insert -- in sign --, therefor.

In column 22, line 46, in Claim 22, delete "(NC0)" and insert -- (NCO) --, therefor.

In column 24, line 13, in Claim 34, delete "a" and insert -- of --, therefor.

Signed and Sealed this

Twenty-fourth Day of February, 2009

JOHN DOLL
*Acting Director of the United States Patent and Trademark Office*